(12) United States Patent
Lee et al.

(10) Patent No.: US 11,849,228 B2
(45) Date of Patent: Dec. 19, 2023

(54) IMAGE SENSING DEVICE

(71) Applicant: SK hynix Inc., Icheon-si (KR)

(72) Inventors: Kyoung In Lee, Icheon-si (KR); Won Jin Kim, Icheon-si (KR); Hoon Sang Oh, Icheon-si (KR); Sung Joo Hong, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/741,702

(22) Filed: May 11, 2022

(65) Prior Publication Data

US 2022/0368844 A1 Nov. 17, 2022

(30) Foreign Application Priority Data

May 17, 2021 (KR) .................. 10-2021-0063468

(51) Int. Cl.
*H04N 25/704* (2023.01)
*H04N 25/11* (2023.01)
*H04N 23/84* (2023.01)

(52) U.S. Cl.
CPC .......... *H04N 25/704* (2023.01); *H04N 23/84* (2023.01); *H04N 25/11* (2023.01)

(58) Field of Classification Search
CPC ..... H04N 25/70; H01L 27/1463; H01L 21/76; H01L 21/762764
USPC .......................................... 348/294
See application file for complete search history.

(56) References Cited

U.S. PATENT DOCUMENTS

2018/0026061 A1 1/2018 Tsai et al.
2020/0243579 A1* 7/2020 Pyo .............. H01L 27/14627
2021/0385400 A1* 12/2021 Jung ............. H01L 27/14623

FOREIGN PATENT DOCUMENTS

| CN | 103140925 A | * | 6/2013 | ....... H01L 27/14623 |
| KR | 20190057601 A | | 5/2019 | |
| TW | 202032772 A | * | 9/2020 | ............. G11C 11/40 |
| WO | WO-2020171191 A1 | * | 8/2020 | ........... H01L 23/544 |

* cited by examiner

*Primary Examiner* — Anthony J Daniels
(74) *Attorney, Agent, or Firm* — Perkins Coie LLP

(57) ABSTRACT

An image sensing device includes a pixel array including a plurality of pixels, each of pixels configured to generate a pixel signal corresponding to intensity of incident light, and a plurality of grid structures, each grid structure disposed to overlap with a boundary between adjacent pixels among the plurality of pixels and configured to include an air layer so as to optically isolate the adjacent pixels. Each of the grid structures includes regions that form a cross shape.

23 Claims, 19 Drawing Sheets

IMAGE SENSING DEVICE

CROSS-REFERENCE TO RELATED APPLICATION

This patent document claims the priority and benefits of Korean patent application No. 10-2021-0063468, filed on May 17, 2021, the disclosure of which is incorporated herein by reference in its entirety as part of the disclosure of this patent document.

TECHNICAL FIELD

The technology and implementations disclosed in this patent document generally relate to an image sensing device including color filters adjacent to each other.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various devices such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, a CMOS fabrication technology can be used to incorporate photosensitive elements and other signal processing circuitry into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device including a high-stability air grid structure. The air grid structure suggested in this patent document has high stability even when air pressure increases in an image sensor including the air grid structure.

In accordance with an embodiment of the disclosed technology, an image sensing device may include a pixel array including a plurality of pixels, each pixels configured to generate a pixel signal corresponding to intensity of incident light, and a plurality of grid structures, each grid structure disposed to overlap with a boundary between adjacent pixels among the plurality of pixels and configured to include an air layer so as to optically isolate the adjacent pixels, wherein each of the grid structures includes regions that form a cross shape.

In accordance with another embodiment of the disclosed technology, an image sensing device may include a pixel configured to generate a pixel signal corresponding to intensity of incident light, and configured to include first to fourth vertex points, and a plurality of grid structures, each of which is disposed at any one of the first to fourth vertex points and including an air layer filled with air, wherein each of the grid structures has a cross shape.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
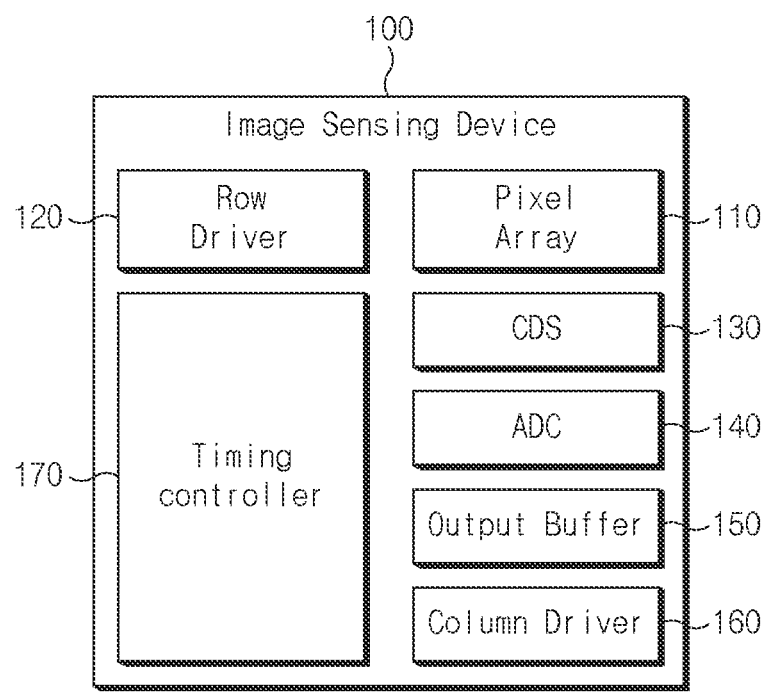
FIG. 1 is a block diagram illustrating an example of an image sensing device based on some implementations of the disclosed technology.

This patent document provides implementations and examples of an image sensing device including color filters adjacent to each other that may be used in configurations to address one or more technical or engineering issues and to mitigate one or more limitations or disadvantages encountered in some other image sensing devices. Some implementations of the disclosed technology relate to the image sensing device including a high-stability air grid structure so that the air grid structure exhibits high stability against variations of the air pressure, e.g., when the air pressure increases in an image sensor including the air grid structure. The disclosed technology provides various implementations of an image sensing device which can distribute pressure applied to a vulnerable point of the air grid, such that the image sensing device including the air grid can effectively prevent collapse (or popping) of the air grid at the vulnerable point of the air grid. The disclosed technology provides various implementations of an image sensing device which can enable the air grid to be formed in a cross shape, so that morphological stability of the air grid can be maintained in a fabrication process of the image sensing device including the air grid.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

FIG. 1 is a block diagram illustrating an image sensing device 100 according to an embodiment of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160, and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns. In another example, the plurality of unit imaging pixels can be arranged in a three dimensional pixel array. The plurality of unit pixels may convert an optical signal into an electrical signal on a unit pixel basis or a pixel group basis, where unit pixels in a pixel group share at least certain internal circuitry. The pixel array 110 may receive driving signals, including a row selection signal, a pixel reset signal and a transmission signal, from the row driver 120. Upon receiving the driving signal, corresponding imaging pixels in the pixel array 110 may be activated to perform the operations corresponding to the row selection signal, the pixel reset signal, and the transmission signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer 150 upon receiving a control signal from the timing controller 170, and control the output buffer 150 to sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, such that the image data are outputted as an output signal from the selected column of the output buffer 150.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
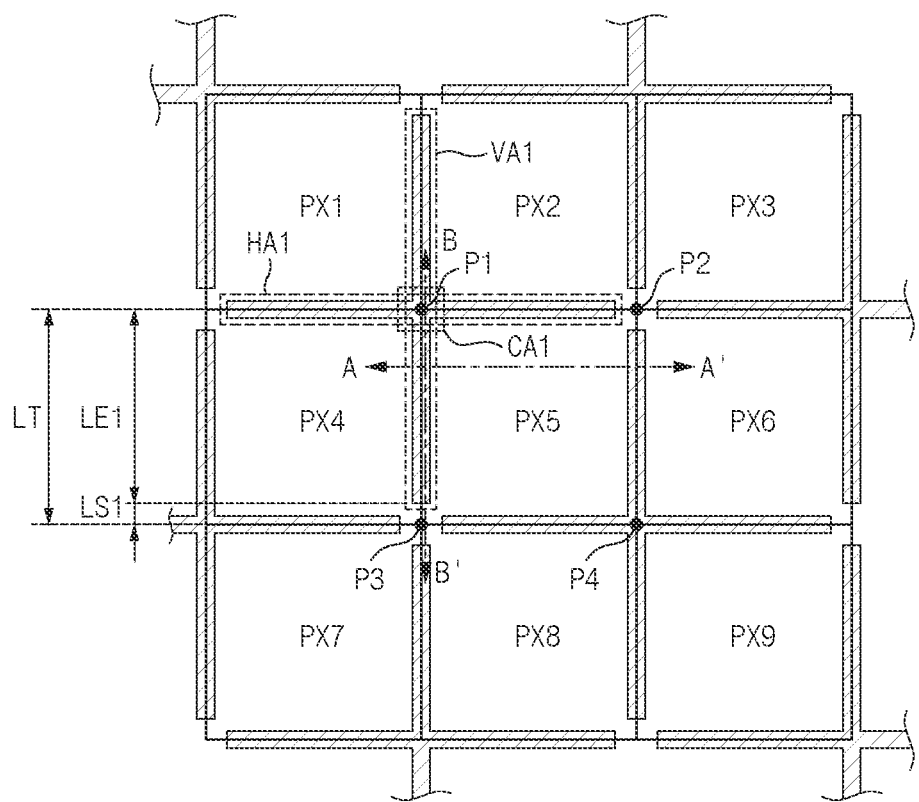
FIG. 2 is a schematic diagram illustrating an example of a pixel array shown in FIG. 1 based on some implementations of the disclosed technology.

FIG. 2 is a schematic diagram illustrating an example of the pixel array shown in FIG. 1 based on some implementations of the disclosed technology.

Referring to FIG. 2, the pixel array 200 is an example of the pixel array 110 shown in FIG. 1, and may include 9 unit pixels PX1~PX9 arranged in a (3×3) matrix array. The unit pixels PX1~PX9 can be referred to as pixels PX1~PX9.

Although only 9 unit pixels PX1~PX9 are shown in FIG. 2, it should be noted that the pixel array 200 shown in FIG. 2 may include a predetermined number of unit pixels arranged in a matrix array including M rows (where M is a positive integer) and N columns (where N is a positive integer) as needed. Although each pixel included in the pixel array 200 is formed in a square shape as an example, other implementations are also possible.

The pixel array 200 may include a first grid structure 210 disposed along a boundary between the adjacent pixels PX1~PX9 for optical isolation. The first grid structure 210 may be configured to include an enclosure which is filled with air to form an air layer as an air grid for isolating adjacent pixels. In some implementations, the first grid structure 210 may have a double-layer structure including an air layer and a metal layer (e.g., tungsten).

In some implementations, the first grid structure 210 may be used to define vertical or horizontal boundaries of the adjacent pixels. In some implementations, the first gird structure 210 may be used to distinguish the adjacent pixels from each other.

The first grid structure 210 may include a first horizontal extension region (HA1) that overlaps with a boundary between adjacent pixels of the pixel array 200 and extends in a horizontal direction (e.g., in a row direction or in a first direction), and a first vertical extension region (VA1) that overlaps with a boundary between adjacent pixels of the pixel array 200 and extends in a vertical direction (e.g., in a column direction or in a second direction). In addition, the first horizontal extension region (HA1) and the first vertical extension region (VA1) may overlap each other in a first central region (CA1). Thus, the first grid structure 210 may be formed in a cross shape in which the first horizontal extension region (HA1) and the first vertical extension region (VA1) cross each other with respect to the first central region (CA1) of the first grid structure 210. The first central region (CA1) may be disposed to overlap with the center point (P1) of four pixels (e.g., PX1, PX2, PX4, and PX5) that are arranged in a (2×2) matrix array.

The pixel (e.g., PX5) may include first to fourth vertex points P1~P4. In some implementations, based on a center point of any one pixel (or matrix), a vertex point located at a left-upper side from the center point will hereinafter be referred to as a first vertex point P1, a vertex point located at a right-upper side from the center point will hereinafter be referred to as a second vertex point P2, a vertex point located at a left-lower side from the center point will hereinafter be referred to as a third vertex point P3, and a vertex point located at a right-lower side from the center point will hereinafter be referred to as a fourth vertex point P4. In addition, the first vertex point and the fourth vertex point that are arranged to face each other in a first diagonal direction (e.g., in a direction in which a horizontal line rotates at a positive angle) may be defined as a first vertex pair. The second vertex point and the third vertex point that are arranged to face each other in a second diagonal direction (e.g., in a direction in which a horizontal line rotates at a negative angle) may be defined as a second vertex pair.

Each of the pixels PX1~PX9 may be surrounded by two first grid structures 210. In the first grid structures 210 surrounding the pixels PX1~PX9, a first central region (CA1) of each of the first grid structures 210 may be disposed at two vertex points that face each other in a diagonal direction of the corresponding pixel. For example, the first central region (CA1) of each of the first grid structures 210 surrounding the pixel PX5 may be disposed at the first vertex point P1 and the fourth vertex point P4 of the pixel PX5.

One side (e.g., a left side) of the pixel (e.g., PX5) may have a total length (LT). The first vertical extension region (VA1) of the first grid structure 210 may extend along the left side of the pixel PX5. The first vertical extension region (VA1) may extend to a first extension length (LE1) from the first vertex point P1. The first extension length (LE1) may be identical to the length from the first vertex point P1 to the end of the first vertical extension region (VA1). In FIG. 2, although it is assumed that the first grid structure 210 extends to the same first extension length (LE1) in upper, lower, left, and right directions of the first vertex point P1 for convenience of description, other implementations are also possible.

The first extension length (LE1) may be less than the total length (LT). The first vertical extension region (VA1) may be spaced apart from the third vertex point P3 by a first separation length (LS1). In some implementations, the first extension length (LE1) may be less than half the total length (LT).

The first extension length (LE1) may be experimentally determined to be as long as possible. Each of the first grid structures 210 may prevent optical crosstalk from occurring between the adjacent pixels. Thus, by determining the first extension length (LE1) to be as long as possible, the size of a region in which the first grid structure 210 is not disposed at the boundary between the adjacent pixels can be minimized. However, the first extension length (LE1) may be experimentally determined so that the adjacent first grid structures 210 (e.g., the first grid structures disposed at upper, lower, left and right sides of the third vertex point P3) can be spaced apart from each other without contacting each other.

Although FIG. 2 illustrates that the first grid structure 210 has upper, lower, left and right ends that have a rectangular shape, other implementations are also possible. For example, the first grid structure 210 may have upper, lower, left and right ends that have a circular round shape. This round structure can guarantee high-temperature resistance than the rectangular structure, because the round structure can easily distribute stress caused by high temperature into the air layer included in the first grid structure 210.

Although the descriptions above have been provided for the first grid structures surrounding the pixel PX5, the substantially same descriptions can be also applied to first grid structures surrounding other pixels.

The first grid structures 210 surrounding pixels (e.g., PX2 and PX4) that are adjacent to the pixel (e.g., PX5) in a vertical or horizontal direction of the pixel PX5 may be disposed at the second vertex point P2 and the third vertex point P3 of the corresponding pixels (e.g., PX2 and PX4). In addition, the first grid structures 210 surrounding pixels (e.g., PX1 and PX9) that are adjacent to the pixel (e.g., PX5) each other in a diagonal direction of the pixel PX5 may be disposed at the first vertex point P1 and the fourth vertex point P4 of the corresponding pixels (e.g., PX1 and PX9). As a result, the first grid structures 210 can be disposed to minimize the size of the region in which the first grid structures 210 are not disposed at a boundary between the adjacent pixels.

The vertex points where the central regions of the first grid structures 210 are located can be alternately changed in the row or column direction of any one pixel. For example, the vertex points P1 and P4 can be changed to other vertex points P2 and P3, and vice versa.

Figure 3:
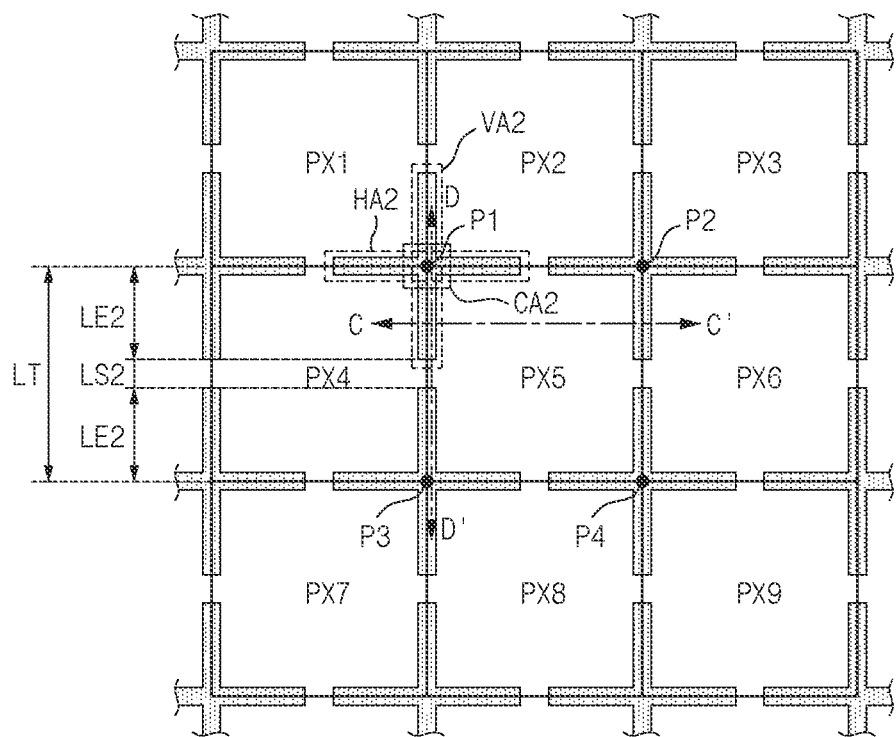
FIG. 3 is a schematic diagram illustrating another example of a pixel array shown in FIG. 1 based on some implementations of the disclosed technology.

FIG. 3 is a schematic diagram illustrating another example of the pixel array shown in FIG. 1 based on some implementations of the disclosed technology.

The pixel array 300 as shown in FIG. 3 is another example of the pixel array 110 shown in FIG. 1, and may include 9 unit pixels PX1~PX9 arranged in a (3×3) matrix array. The pixel array 300 has characteristics substantially identical in structure to those of the pixel array 200 shown in FIG. 2, and thus the redundant description thereof will herein be omitted for brevity. In the below, the different characteristics of the pixel array 300 from those of the pixel array 200 shown in FIG. 2 will be described.

The pixel array 300 may include a second grid structure 310 disposed along a boundary between the adjacent pixels PX1~PX9 for optical isolation. The second grid structure 310 may include an air layer filled with or including air. In some implementations, the second grid structure 310 may have a double-layer structure including an air layer and a metal layer (e.g., tungsten).

In some implementations, the second grid structure 310 may include a second horizontal extension region (HA2) formed to extend in a horizontal direction (e.g., in a row direction) of the pixel array 300, and a second vertical extension region (VA2) formed to extend in a vertical direction (e.g., in a column direction) of the pixel array 300. In addition, the second horizontal extension region (HA2) and the second vertical extension region (VA2) may overlap each other in a second central region (CA2). In some implementations, the second grid structure 310 may be formed in a cross shape in which the second horizontal extension region (HA2) and the second vertical extension region (VA2) cross each other with respect to the second central region (CA2) of the second grid structure 310. The second central region (CA2) may be disposed to overlap with the center point (P1) of four pixels (e.g., PX1, PX2, PX4, and PX5) arranged in a (2×2) matrix array.

Each of the pixels PX1~PX9 may be surrounded by four second grid structures 310. In the second grid structures 310 surrounding the pixels PX1~PX9, a second central region (CA2) of each of the second grid structures 310 may be disposed at four vertex points of the corresponding pixel. For example, the second central region (CA2) of each of the second grid structures 310 surrounding the pixel PX5 may be disposed at the first to fourth vertex points P1~P4 of the pixel PX5.

One side (e.g., a left side) of the pixel (e.g., PX5) may have a total length (LT). The second vertical extension region (VA2) of the second grid structure 310 disposed at the first vertex point P1 may extend along the left side of the pixel PX5, and may extend to a second extension length (LE2) from the first vertex point P1. In addition, the second vertical extension region (VA2) of the second grid structure 310 disposed at the third vertex point P3 may extend along the left side of the pixel PX5, and may extend to a second extension length (LE2) from the third vertex point P3. In FIG. 3, although it is assumed that the second grid structure 310 extends to the same second extension length (LE2) in upper, lower, left, and right directions of the first vertex point P1 or the third vertex point P3, other implementations are also possible.

The second extension length (LE2) may be less than the total length (LT). The adjacent second grid structures 310 may be spaced apart from each other by a second separation length (LS2). In some implementations, the second extension length (LE2) may be less than half the total length (LT).

The second extension length (LE2) may be experimentally determined to have as high a value as possible. Each of the second grid structures 310 may prevent optical crosstalk from occurring between the adjacent pixels, so that the size of a region in which the second grid structure 310 is not disposed at the boundary between the adjacent pixels can be minimized. However, the second extension length (LE2) may be experimentally determined so that the adjacent second grid structures 310 (e.g., the second grid structures respectively disposed at the vertex points P1 and P3) can be spaced apart from each other without contacting each other.

Although the descriptions above have been provided for the second grid structures surrounding the pixel PX5, the substantially the same descriptions can also be easily applied to another second grid structure.

The second grid structures 310 shown in FIG. 3 may have symmetry in diagonal, horizontal, and vertical directions with respect to the center point of the pixel PX5. Due to this symmetry, photo response non-uniformity (PRNU) noise caused by imbalance in the amount of reception (Rx) light between the pixels can be reduced.

Each of the first grid structures 210 and each of the second grid structures 310 may be identical or similar in shape to a Greek cross shape.

The first grid structure 210 shown in FIG. 2, the second grid structure 310 shown in FIG. 3, a third grid structure 220 to be described later with reference to FIG. 14A, and a fourth grid structure 225 to be described later with reference to FIG. 14B may be collectively referred to as a grid structure only.

Figure 4A:
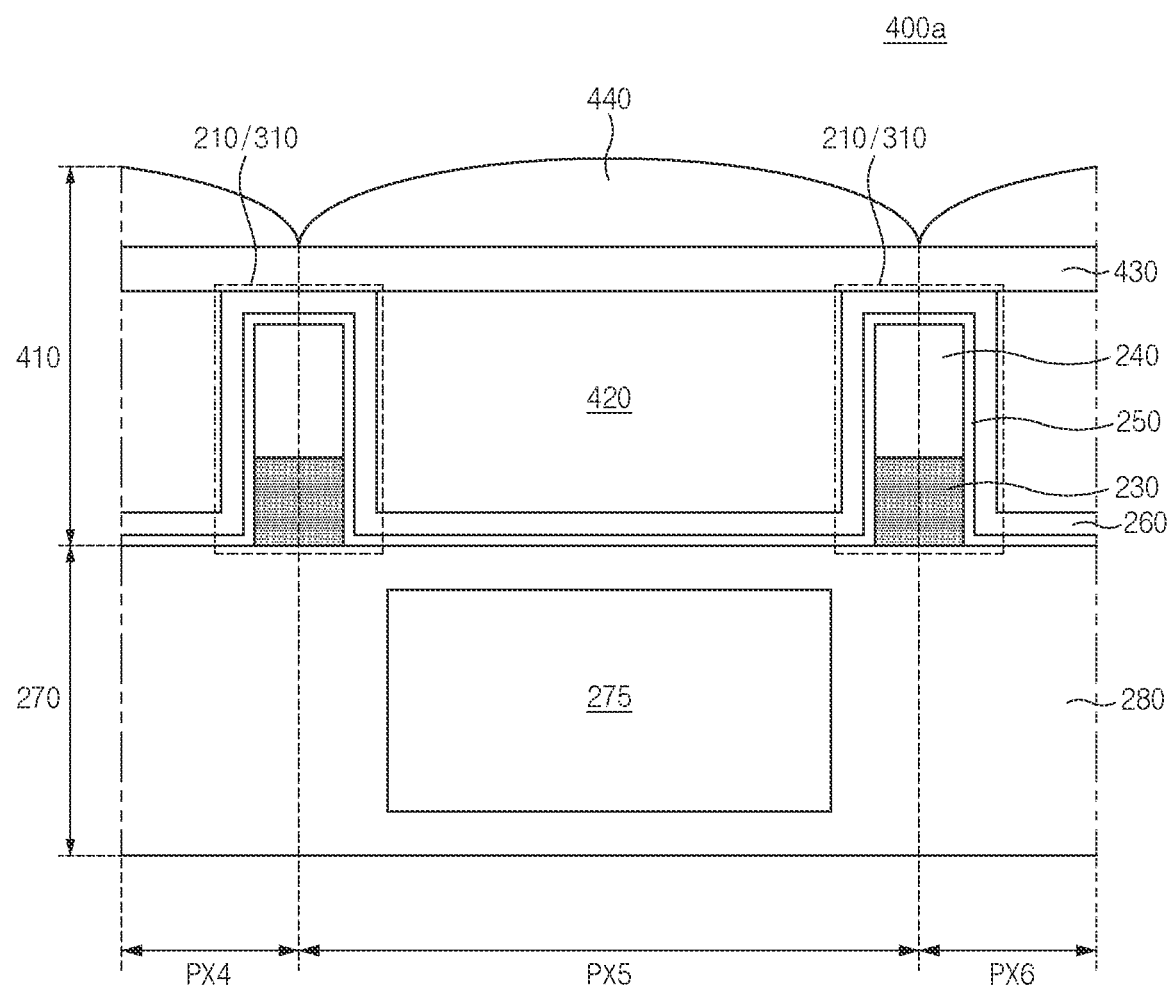
FIG. 4A is a cross-sectional view illustrating an example of a pixel array taken along a first cutting line shown in FIG. 2 or a third cutting line shown in FIG. 3 based on some implementations of the disclosed technology.

FIG. 4A is a cross-sectional view 400a illustrating an example of the pixel array taken along a first cutting line A-A' shown in FIG. 2 or a third cutting line C-C' shown in FIG. 3 based on some implementations of the disclosed technology.

Referring to FIG. 4A, a cross-section 400a of the pixel array taken along the first cutting line A-A' shown in FIG. 2 or the third cutting line C-C' shown in FIG. 3 is illustrated. In more detail, the cross-section 400a of the pixel array taken along the first cutting line A-A' or the third cutting line C-C' may illustrate some parts of the pixel PX4 located at the left side from the pixel PX5 and some parts of the pixel PX6 located at the right side from the pixel PX5. Although the cross-sectional view shown in FIG. 4A will be described centering upon the cross-section of one pixel PX5, other implementations are also possible, and other pixels included in the pixel array 110 may be substantially identical in structure to the cross-sectional view of FIG. 4A.

The cross-section 400a is a cross-sectional view of the pixel array taken along the first cutting line A-A' or the third cutting line C-C', so that the first grid structure 210 or the second grid structure 310 is shown in FIG. 4A. As an example, the first grid structure 210 will hereinafter be described with reference to FIG. 4A. It should be noted that the descriptions of the first grid structure 210 can also be applied to the second grid structure 310.

The cross-section 400a may include a substrate 270 and a light incident layer 410.

The substrate 270 may include a top surface and a bottom surface facing each other. Although the top surface of the substrate 270 can be defined as a front side and the bottom surface of the substrate 270 can be defined as a back side for convenience of description, other implementations are also possible. For example, the substrate 270 may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate. The substrate 270 may include a P-type or N-type doped region 280 having P-type or N-type conductive impurities.

In FIG. 4A, the substrate 270 may include a photoelectric conversion region 275 surrounded by the P-type or N-type doped region 280. The photoelectric conversion region 275 may be disposed in a region corresponding to the pixel PX5 in the substrate 270. The photoelectric conversion region 275 may be formed as an N-type doped region through ion implantation of N-type ions. In some implementations, the photoelectric conversion region 275 such as a photodiode may be formed by stacking a plurality of doped regions. In this case, a lower doped region may be formed by implantation of $N^+$ ions, and an upper doped region may be formed by implantation of $N^-$ ions. The photoelectric conversion region 275 may be arranged to occupy a region as large as possible to increase a fill factor indicating light reception (Rx) efficiency. In some implementations, a device isolation layer (not shown) disposed between the photoelectric conversion regions of the adjacent pixels may be formed to be deeply etched in a vertical direction, so that the device isolation layer can electrically or optically isolate the adjacent pixels that are located adjacent to each other.

The light incident layer 410 may receive incident light from the outside of the pixel array 110, and may transmit the received incident light to the substrate 270. The light incident layer 410 may include one or more metal layers 230, a first capping layer 250, a second capping layer 260, an optical filter 420, an over-coating layer 430, and/or a microlens 440 where capping layers 250 and 260 are structured to protrude above the metal layers 230 at the boundaries between adjacent pixels to form an enclosure with the metal layers 230 which is filled with air to form the one or more air layers 240.

The metal layer 230 may be disposed over the substrate 270. The metal layer 230 may be formed of or include a metal material (e.g., tungsten) having a high light absorption rate, or may also be formed by stacking different kinds of materials.

The air layer 240 may be disposed over the metal layer 230, and the shape of the air layer 240 may be defined by the first capping layer 250. The air layer 240 may be filled with or include air having a relatively low refractive index (e.g., a refractive index of 1).

The first capping layer 250 may be formed to surround the entirety of the air layer 240 and the metal layer 230. Thus, the first capping layer 250 may be formed to contact a top surface of the air layer 240 and a side surface of each of the air layer 240 and the metal layer 230. The air layer 240 and the metal layer 230 may be physically isolated by the first capping layer 250 from the outside. For example, the first capping layer 250 may be an Ultra Low Temperature Oxide (ULTO) film such as a silicon oxide film ($SiO_2$).

The second capping layer 260 may be formed to surround the entirety of the first capping layer 250. One side surface of the second capping layer 260 may be in contact with the first capping layer 250, and the other side surface of the second capping layer 260 may be in contact with the outside of the first grid structure 210. Therefore, the first capping layer 250 may be physically isolated from the outside by the second capping layer 260. For example, the second capping layer 260 may be formed of an insulation layer that includes at least one of a silicon oxide nitride film ($Si_xO_yN_z$, where each of 'x', 'y', and 'z' is a natural number), a silicon oxide film ($Si_xO_y$, where each of 'x' and 'y' is a natural number), and a silicon nitride film ($Si_xN_y$, where each of 'x' and 'y' is a natural number).

The second capping layer 260 may be larger in thickness than the first capping layer 250. The reason why the second capping layer 260 has a larger thickness than the first capping layer 250 is that the first capping layer 250 is formed as thin as possible in a manner that internal materials of the first capping layer 250 can be effectively discharged outside during the plasma process, and the second capping layer 250 is formed to a predetermined thickness through which the shape of the first grid structure 210 including the air layer 240 can be stably maintained.

In some other implementations, a support layer for maintaining the shape of the first grid structure 210 may be formed not only at a region corresponding to a lower portion of the first capping layer 250 included in the first grid structure 210, but also at a region corresponding to an upper portion of the air layer 240. In some implementations, the support layer may be an insulation layer having no light absorption characteristics.

In some implementations, the first capping layer 250 and the second capping layer 260 may be formed of or include the same materials, such that the first capping layer 250 and the second capping layer 260 may also have the same refractive index.

In some implementations, the refractive index of each of the first capping layer 250 and the second capping layer 260 may be higher than that of the air layer 240, and may be lower than that of the optical filter 420.

A method for forming the air layer 240 may include forming a sacrificial layer (not shown) having a pattern corresponding to the shape of the air layer 240 over the metal layer 240, forming the first capping layer 250 over the entirety of the sacrificial layer, the metal layer 230, and the substrate 270, and removing the sacrificial layer through the plasma process, resulting in formation of the air layer 240. In this case, the sacrificial layer may include a carbon-containing Spin On Carbon (SOC) film. In addition, the plasma process may be carried out using gas (e.g., $O_2$, $N_2$, $H_2$, CO, $CO_2$, or $CH_4$) including at least one of oxygen, nitrogen, and hydrogen. In this case, the above-mentioned processes will hereinafter be described using the $O_2$ plasma process as an example. If the $O_2$ plasma process is carried out upon the resultant structure, oxygen radicals (O*) may flow into the sacrificial layer through the first capping layer 250, and the oxygen radicals (O*) included in the sacrificial layer may be combined with carbons of the sacrificial layer, resulting in formation of CO or $CO_2$. The formed CO or $CO_2$ may be discharged outside through the first capping layer 250. As a result, the sacrificial layer may be removed, and the air layer 240 may be formed at the position from which the sacrificial layer is removed.

The stacked structure of the metal layer 230 and the air layer 240, and the first and second capping layers 250 and 260 surrounding the stacked structure of the metal layer 230 and the air layer 240 may correspond to the first grid structure 210.

The first grid structure 210 may prevent incident light applied to the optical filter from being shifted to another color filter, such that optical crosstalk can be minimized.

In more detail, since the refractive index (e.g., 1) of the air layer 240 filled with or including air is lower than the refractive index (e.g., 1.6-1.7) of the optical filter 420 and the refractive index (e.g., 1.4) of each of the first capping layer 250 and the second capping layer 260, the air layer 240 may induce reflection of light such that incident light can be reflected into the pixel (e.g., PX5).

Even when such reflection caused by the air layer 240 according to various incident angles does not occur and some parts of incident light are refracted and introduced into the air layer 240 according to such incident angles, light absorption caused by the metal layer 230 may occur, resulting in prevention of optical crosstalk.

As can be seen from FIG. 4A, although the top surface of the optical filter 420 has the same height as the first grid structure 210, other implementations are also possible, and it should be noted that the top surface of the optical filter 420 may be higher or lower in height than the first grid structure 210.

Each of the first capping layer 250 and the second capping layer 260 that construct the first grid structure 210 disposed at one side of the optical filter 420 may be formed to extend between the optical filter 420 and the substrate 270, and may be disposed below the optical filter 420. In addition, the first capping layer 250 and the second capping layer 260 disposed below the optical filter 420 may be respectively coupled to the first capping layer 250 and the second capping layer 260 that construct the first grid structure 210 disposed at the other side of the optical filter 420. Thus, the first capping layer 250 and the second capping layer 260 that construct the first grid structure 210 contacting the optical filter 420 may be respectively integrated with the first capping layer 250 and the second capping layer 260 disposed below the optical filter 420.

Therefore, the first capping layer 250 and the second capping layer 260 configured to maintain the shape of the first grid structure 210 may be formed to contact another structure (e.g., the substrate 270) in a wider region as compared to the other case in which the first capping layer 250 and the second capping layer 260 are not disposed below the optical filter 420, resulting in increased stability in shape of the first grid structure 210. Due to balance between first tension, that is generated by the first capping layer 250 and the second capping layer 260 disposed below the optical filter 420 located at the left side of the first grid structure 210, and second tension, that is generated by the first capping layer 250 and the second capping layer 260 disposed below the other optical filter located at the right side of the first grid structure 210, the first grid structure 210 having a narrow width may be prevented from being tilted to the left or right.

In addition, each of the first capping layer 250 and the second capping layer 260 disposed below the optical filter 420 may serve as an anti-reflection layer that compensates for a difference in refractive index between the optical filter 420 and the substrate 270 such that light having passed through the optical filter 420 can be effectively incident into the substrate 270. Therefore, although a separate anti-reflection layer is not disposed between the optical filter 420 and the substrate 270, each of the first capping layer 250 and the second capping layer 260 may serve as the anti-reflection layer, such that a vertical thickness of the pixel may be reduced.

The optical filter 420 may be formed over the substrate region 270. The optical filter 420 may selectively transmit a light signal (e.g., red light, green light, blue light, magenta light, yellow light, cyan light, or the like) having a specific wavelength. In some implementations, when the unit pixel PX5 corresponds to a depth pixel, the optical filter 420 may be omitted or may be replaced with an infrared (IR) filter.

The over-coating layer 430 may be disposed over the optical filter 420 and the first grid structure 210, and may prevent diffused reflection of incident light received from the outside, thereby suppressing flare characteristics. In addition, the over-coating layer 430 may compensate for a step difference between the optical filter 420 and the first grid structure 210, so that the over-coating layer 430 may allow the microlens 440 to have a constant height.'

The microlens 440 may be formed over the over-coating layer 430, and may increase light gathering power of incident light, resulting in increased light reception (Rx) efficiency of the photoelectric conversion region 275. Although FIG. 4A illustrates that one microlens 440 corresponds to one pixel PX5, other implementations are also possible, and it should be noted that, in the case of using a specific pixel such as a phase detection autofocus (PDAF) pixel, only one microlens may also correspond to a plurality of pixels as needed.

Figure 4B:
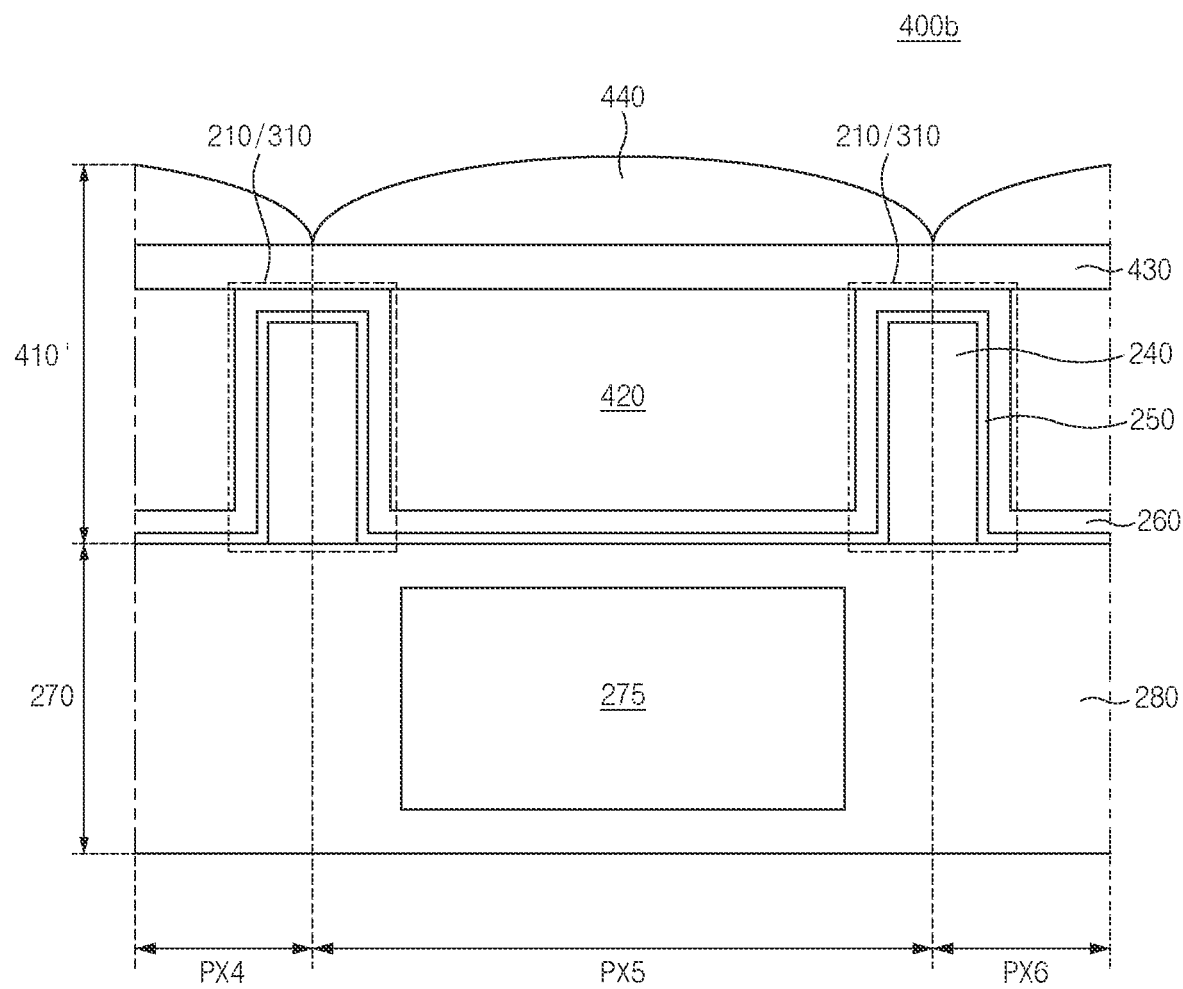
FIG. 4B is a cross-sectional view illustrating another example of a pixel array taken along the first cutting line shown in FIG. 2 or the third cutting line shown in FIG. 3 based on some implementations of the disclosed technology.

FIG. 4B is a cross-sectional view illustrating another example of the pixel array taken along the first cutting line A-A' shown in FIG. 2 or the third cutting line C-C' shown in FIG. 3 based on some implementations of the disclosed technology.

Referring to FIG. 4B, a cross-section 400b of the pixel array taken along the first cutting line A-A' shown in FIG. 2 or the third cutting line C-C' shown in FIG. 3 is illustrated. The remaining parts of the cross-section 400b shown in FIG. 4B other than some characteristics different from those of the cross-section 400a shown in FIG. 4A may be substantially identical in structure to the cross-section 400a shown in FIG. 4A, and as such redundant description thereof will herein be omitted for brevity.

A light incident layer 410' included in the cross-section 400b may not include the metal layer 230. That is, the first grid structure 210 or the second grid structure 310 shown in FIG. 4B may not have a dual structure in which the metal layer 230 and the air layer 240 are stacked as shown in FIG. 4A, and may have a single structure including only the air layer 240 other than the metal layer 230.

Figure 5A:
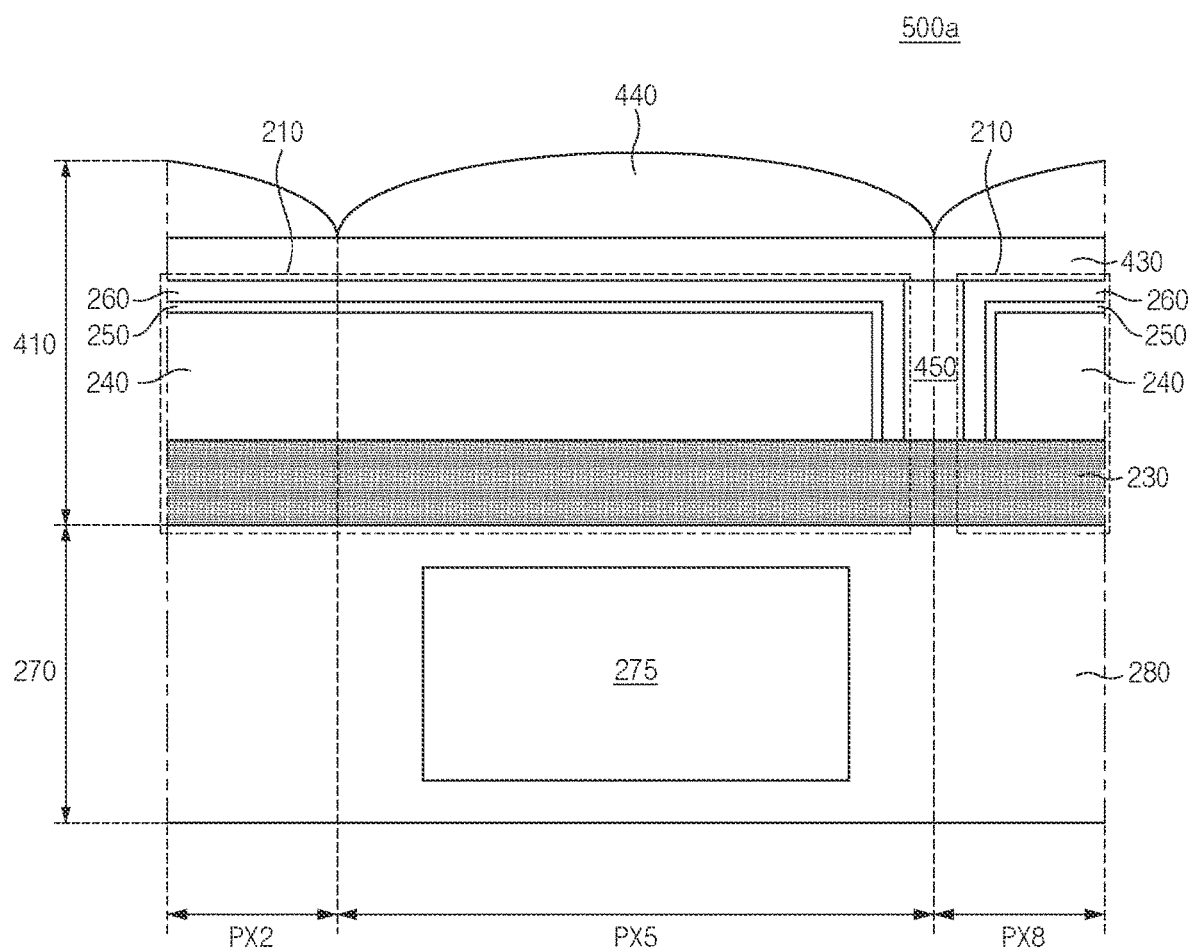
FIG. 5A is a cross-sectional view illustrating an example of a pixel array taken along a second cutting line shown in FIG. 2 based on some implementations of the disclosed technology.

FIG. 5A is a cross-sectional view 500a illustrating an example of the pixel array taken along a second cutting line B-B' shown in FIG. 2 based on some implementations of the disclosed technology.

Referring to FIG. 5A, a cross-section 500a of the pixel array taken along the second cutting line B-B' shown in FIG. 2 is illustrated. In more detail, the cross-section 500a of the pixel array taken along the second cutting line B-B' may illustrate some parts of the pixel PX2 located at an upper side from the pixel PX5 and some parts of the pixel PX8 located at a lower side from the pixel PX5. Although the cross-sectional view shown in FIG. 5A will be described centering upon the cross-section of one pixel PX5, other implementations are also possible, and other pixels included in the pixel array 110 may be substantially identical in structure to the cross-sectional view of FIG. 5A.

The cross-section 500a may include the substrate 270 and the light incident layer 410. The structures, materials, and functions of the constituent elements included in the cross-section 500a shown in FIG. 5A are identical to those of FIG. 4A, and as such redundant description thereof will herein be omitted for brevity.

The first grid structure 210 disposed in the pixel PX5 and the first grid structure 210 disposed in the pixel PX8 may be spaced apart from each other by a predetermined distance, so that the air layers 240 included in the first grid structures 210 adjacent to each other can be physically isolated from each other. A region located between the first grid structure 210 disposed in the pixel PX5 and the other first grid structure 210 disposed in the pixel PX8 may be defined as a gap region 450. The metal layer 230 may be disposed below the gap region 450. The gap region 450 may refer to a region corresponding to the inside of virtual extension straight lines for interconnecting the first grid structures 210 adjacent to each other in the plane of FIG. 2.

Figure 5B:
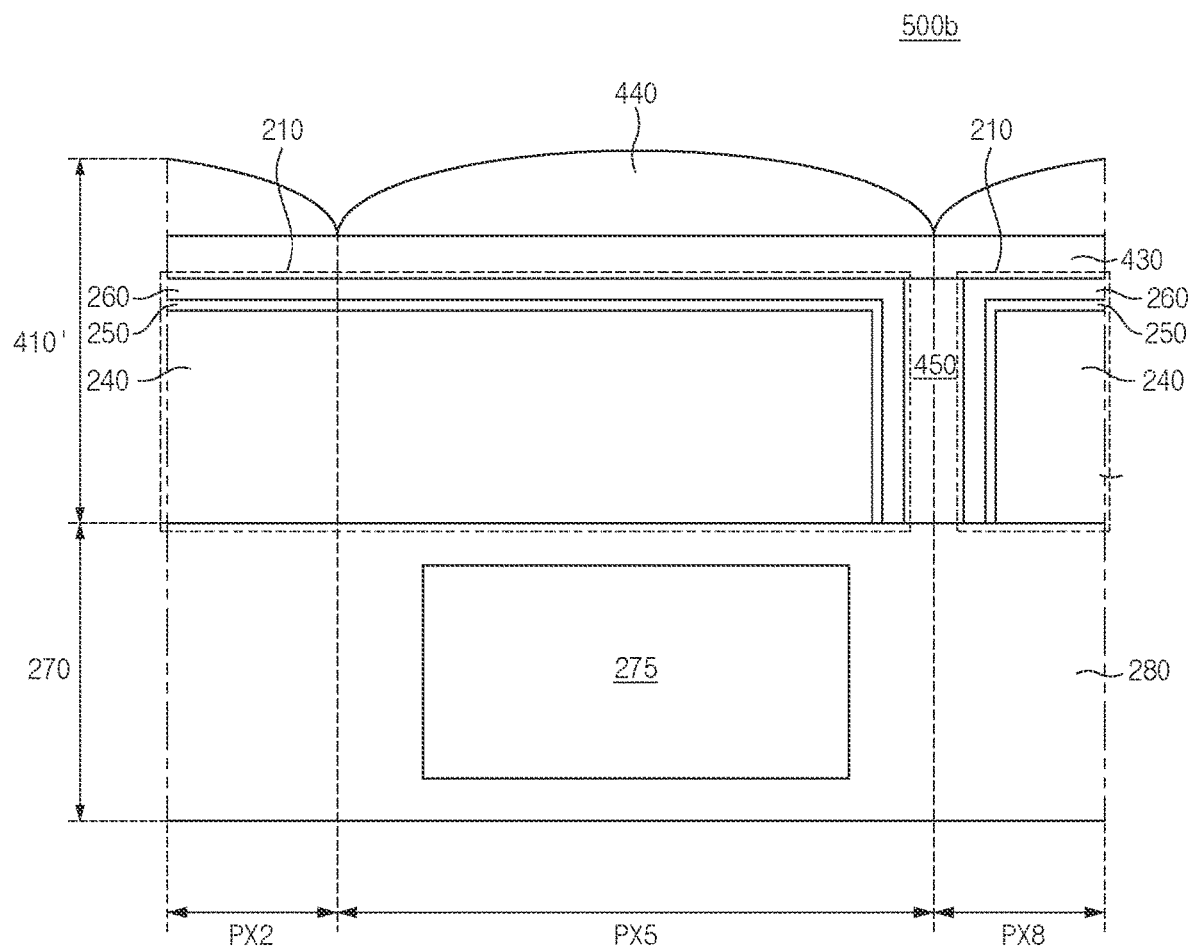
FIG. 5B is a cross-sectional view illustrating another example of the pixel array taken along the second cutting line shown in FIG. 2 based on some implementations of the disclosed technology.

FIG. 5B is a cross-sectional view illustrating another example of the pixel array taken along the second cutting line B-B' shown in FIG. 2 based on some implementations of the disclosed technology.

Referring to FIG. 5B, a cross-section 500b of the pixel array taken along the second cutting line B-B' shown in FIG. 2 is illustrated. The remaining parts of the cross-section 500b shown in FIG. 5B other than some characteristics different from those of the cross-section 500a shown in FIG. 5A may be substantially identical in structure to the cross-section 500a shown in FIG. 5A, and as such redundant description thereof will herein be omitted for brevity.

A light incident layer 410' included in the cross-section 500b may not include the metal layer 230. That is, the first grid structure 210 or the second grid structure 310 shown in FIG. 5B may not have a dual structure in which the metal layer 230 and the air layer 240 are stacked as shown in FIG. 5A, and may have a single structure including only the air layer 240 other than the metal layer 230.

In some other implementations, even when the first grid structure 210 has the single structure including only the air layer 240 other than the metal layer 230, the metal layer 230 may be disposed below the gap region 450.

Figure 6A:
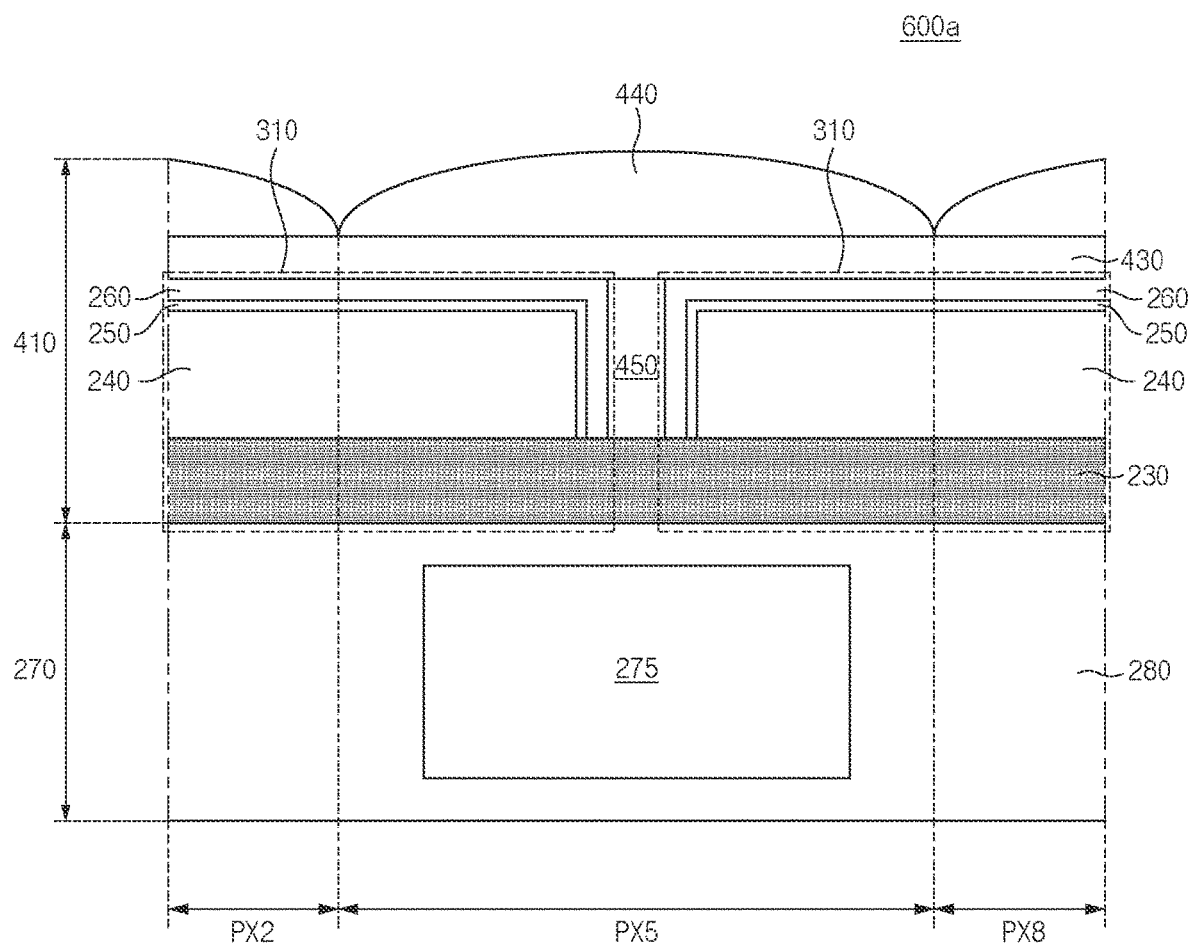
FIG. 6A is a cross-sectional view illustrating an example of the pixel array taken along a fourth cutting line shown in FIG. 3 based on some implementations of the disclosed technology.

FIG. 6A is a cross-sectional view illustrating an example of the pixel array taken along a fourth cutting line D-D' shown in FIG. 3 based on some implementations of the disclosed technology.

Referring to FIG. 6A, a cross-section 600a of the pixel array taken along the fourth cutting line D-D' shown in FIG. 3 is illustrated. In more detail, the cross-section 600a of the pixel array taken along the fourth cutting line D-D' may illustrate some parts of the pixel PX2 located at an upper side from the pixel PX5 and some parts of the pixel PX8 located at a lower side from the pixel PX5. Although the cross-sectional view shown in FIG. 6A will be described centering upon the cross-section of one pixel PX5, other implementations are also possible, and other pixels included in the pixel array 110 may be substantially identical in structure to the cross-sectional view of FIG. 6A.

The cross-section 600a may include the substrate 270 and the light incident layer 410. The structures, materials, and functions of the constituent elements included in the cross-section 600a shown in FIG. 6A are identical to those of FIG. 4A, and as such redundant description thereof will herein be omitted for brevity.

The second grid structures 310 disposed in the pixel PX5 may be spaced apart from each other by a predetermined distance, so that the air layers 240 included in the second grid structures 310 adjacent to each other can be physically isolated from each other. A region located between the adjacent second grid structures 310 may be defined as a gap region 450. The metal layer 230 may be disposed below the gap region 450. The gap region 450 may refer to a region corresponding to the inside of virtual extension straight lines for interconnecting the second grid structures 310 adjacent to each other in the plane of FIG. 3.

Figure 6B:
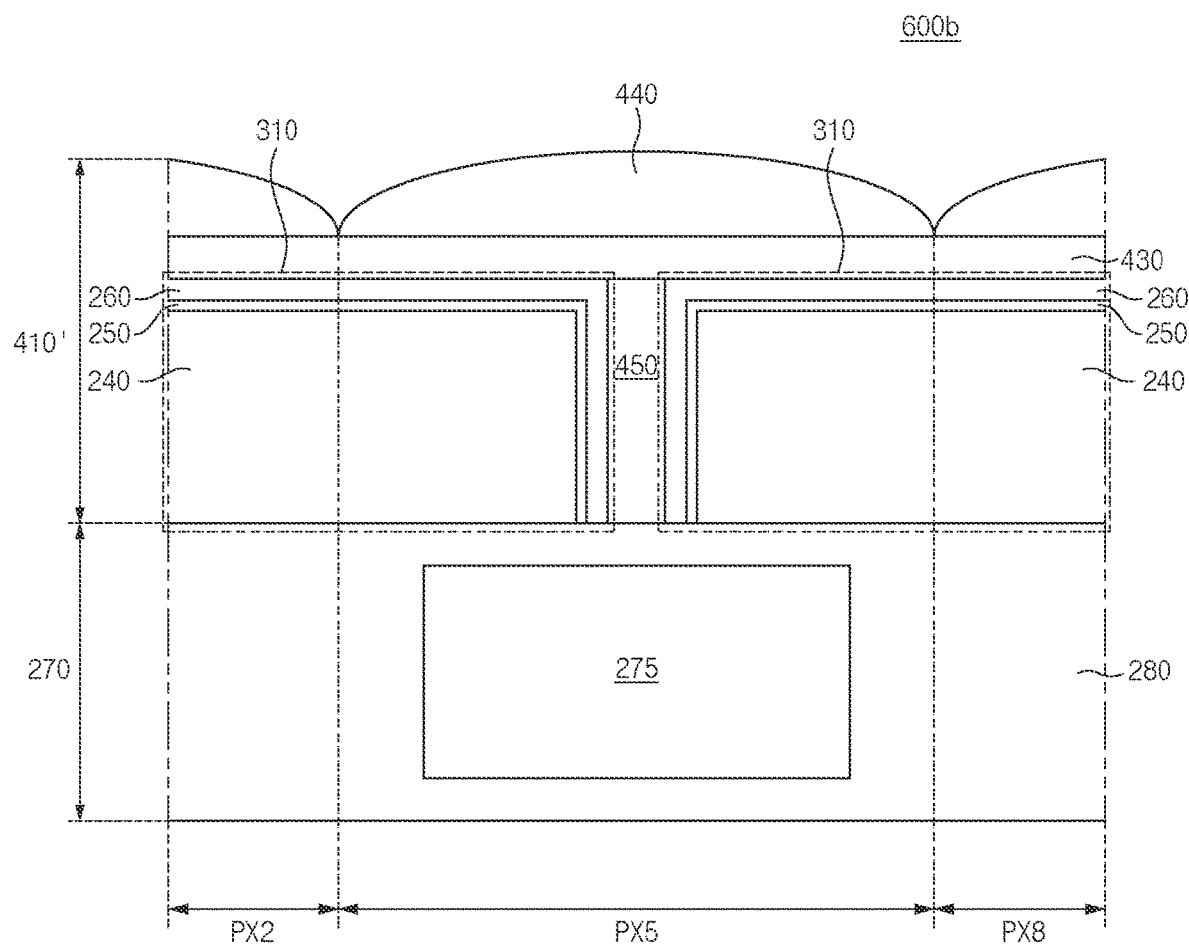
FIG. 6B is a cross-sectional view illustrating another example of the pixel array taken along a fourth cutting line shown in FIG. 3 based on some implementations of the disclosed technology.

FIG. 6B is a cross-sectional view illustrating another example of the pixel array taken along the fourth cutting line D-D' shown in FIG. 3 based on some implementations of the disclosed technology.

Referring to FIG. 6B, a cross-section 600b of the pixel array taken along the fourth cutting line D-D' shown in FIG. 3 is illustrated. The remaining parts of the cross-section 600b shown in FIG. 6B other than some characteristics different from those of the cross-section 600a shown in FIG.

6A may be substantially identical in structure to the cross-section 600a shown in FIG. 6A, and as such redundant description thereof will herein be omitted for brevity.

A light incident layer 410' included in the cross-section 600b may not include the metal layer 230. That is, the first grid structure 210 or the second grid structure 310 shown in FIG. 6B may not have a dual structure in which the metal layer 230 and the air layer 240 are stacked as shown in FIG. 6A, and may have a single structure including only the air layer 240 other than the metal layer 230.

In some other implementations, even when the second grid structure 310 has the single structure including only the air layer 240 other than the metal layer 230, the metal layer 230 may be disposed below the gap region 450.

Differently from the structures shown in FIGS. 5A to 6B, it is assumed that the grid structures are formed in a mesh-type structure in which the air layers 240 of the entire pixel array 110 are integrated into one region without formation of the gap region 450 for convenience of description and better understanding of the disclosed technology.

In this case, since each of the first capping layer 250 and the second capping layer 260 is formed as a thin film, a vulnerable point may exist in a specific portion of the first and second capping layers 250 and 260 due to a limitation in fabrication processes and use environments (e.g., a high-temperature condition). Such vulnerable point can cause collapse (or popping) of the first and second capping layers 250 and 260 due to pressure generated in the specific portion. Pressures applied to the vulnerable point may increase in proportion to temperature and volume of internal air of the air layer 240. In the case of using the mesh-type structure in which the air layers 240 of the entire pixel array 110 are interconnected through a single region, pressures corresponding to the volume of the air layers 240 of the entire pixel array 110 can be applied to the vulnerable point, which causes collapse (or popping) of the pixel array in the vulnerable point.

However, the grid structure (i.e., air grid structure) suggested in this patent document may allow the air layers 240 of the first and second grid structures 210 and 310 to be physically isolated from each other by the gap region 450 interposed therebetween. As a result, the amount of the pressures applied to the vulnerable point can be reduced. Thus, instead of applying pressures corresponding to volume of the air layers 240 of the entire pixel array 110 to the vulnerable point, pressures corresponding to the volume of each of the air layers 240 may be applied to the vulnerable point. In this way, the pressures applied to the vulnerable point can be dispersed and thus collapse (or popping) of the air grid structure at the vulnerable point can be effectively prevented.

In the grid structure based on some implementations of the disclosed technology, each of the first and second grid structures 210 and 310 is formed in a cross shape, so that the first and second grid structures 210 and 310 can be prevented from collapsing (or leaning) in a fabrication process. In particular, the first and second grid structures 210 and 310 and the optical filter 420 may be sequentially formed. If an alignment issue wherein the optical filter 420 is installed at the wrong position occurs in a process of forming the optical filter 420, a rework process capable of removing the optical filter 420 installed at the wrong position using liquid to be sprayed on the optical filter 420 can be carried out in the process of forming the optical filter 420. In the rework process, strong pressure can be applied to the first and second grid structures 210 and 310. If it is assumed that each of the first and second grid structures 210 and 310 is formed in a linear structure that includes only the horizontal extension region HA1 or HA2 or only the vertical extension region VA1 or VA2, the horizontal extension regions HA1 and HA2 or the vertical extension regions VA1 and VA2 may collapse (or lean) in the direction of liquid spraying in the rework process, because there occurs pressure generated from the other direction different from the extension direction of either the horizontal extension regions HA1 and HA2 or the vertical extension regions VA1 and VA2.

However, each of the first and second grid structures 210 and 310 is formed in a cross shape, pressure applied to the horizontal extension regions HA1 and HA2 in the rework process may be distributed by the vertical extension regions VA1 and VA2 supporting the horizontal extension regions HA1 and HA2, and pressure applied to the vertical extension regions VA1 and VA2 in the rework process may be distributed by the horizontal extension regions HA1 and HA2 supporting the vertical extension regions VA1 and VA2, collapse of the horizontal extension regions HA1 and HA2 or the vertical extension regions VA1 and VA2 can be prevented.

Figure 7:
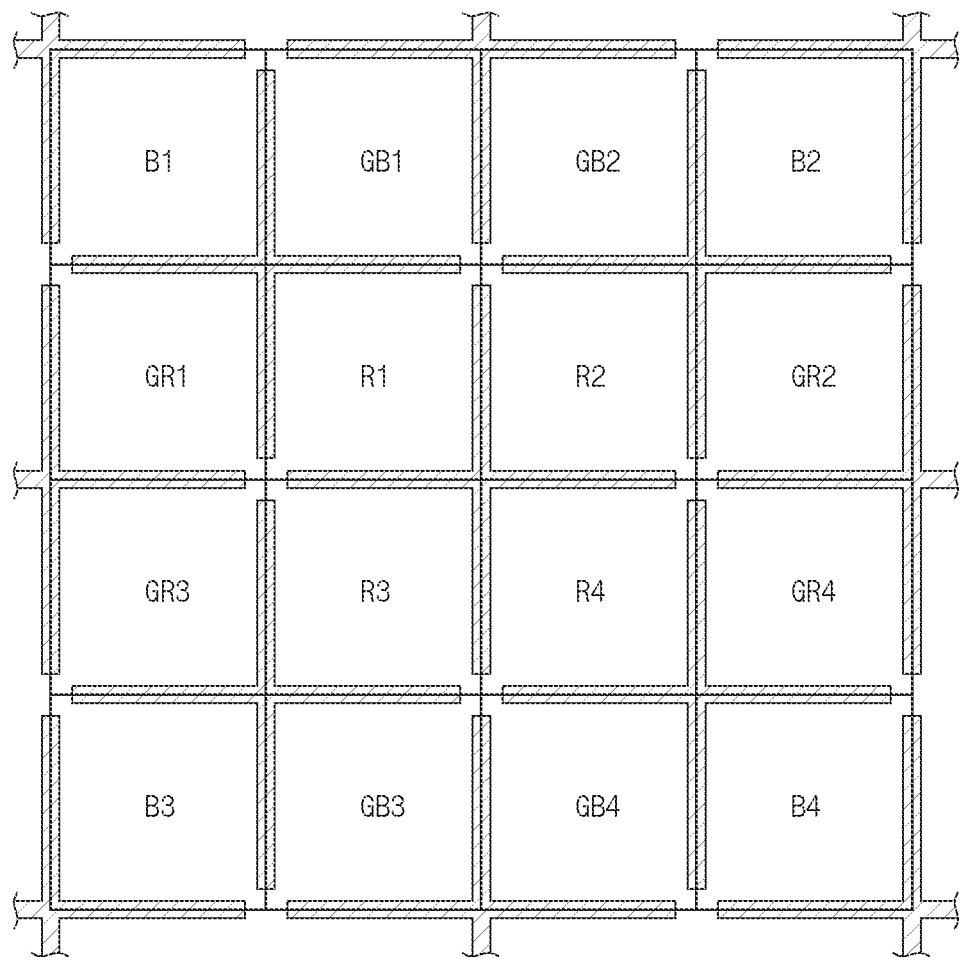
FIG. 7 is a schematic diagram illustrating an example of a first grid structure arranged in a pixel array arranged in a quad pixel structure based on some implementations of the disclosed technology.
Figure 7:
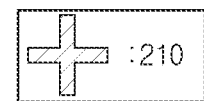

FIG. 7 is a schematic diagram illustrating an example of a first grid structure arranged in a pixel array arranged in a quad pixel structure based on some implementations of the disclosed technology.

The pixel array 700 as shown in FIG. 7 corresponds to an example of a part of the pixel array 110 shown in FIG. 1. In the example of FIG. 7, the pixel array 700 includes first to fourth red pixels R1~R4, first to fourth blue pixels B1~B4, and first to fourth green pixels GB1~BG4 and GR1~GR4. The first to fourth green pixels GB1~GB4 are adjacent to blue pixels in the row direction of the pixel array, and the first to fourth green pixels GR1~GR4 are adjacent to red pixels in the row direction of the pixel array. Each green pixel may include a green optical filter configured to pass a wavelength band corresponding to green light. Each red pixel may include a red optical filter configured to pass a wavelength band corresponding to red light. Each blue pixel may include a blue optical filter configured to pass a wavelength band corresponding to blue light.

The plurality of pixels included in the pixel array 700 may be arranged in a quad pixel structure. The quad pixel structure may refer to a structure in which four pixels having the same color (e.g., red, blue, or green) are arranged in a (2×2) matrix array, and one red matrix in which four red pixels are arranged in a (2×2) matrix array, one blue matrix in which four blue pixels are arranged in a (2×2) matrix array, and two green matrices, each of which includes four green pixels arranged in a (2×2) matrix array, are arranged in a Bayer pattern. Each of the red matrix, the blue matrix, and the green matrix may be referred to as a color matrix.

Although FIG. 7 illustrates that the first grid structure 210 is arranged at a center of the red matrix, other implementations are also possible. When the first gird structure 210 is arranged at the center of the blue or green matrix, the substantially same descriptions as those for the red matrix can also be applied to the blue matrix and the green matrix.

The center of the red matrix may overlap with the central region of the first grid structure 210. In this case, the center of the red matrix may refer to a fourth vertex point of a first red pixel R1, a third vertex point of a second red pixel R2, a second vertex point of a third red pixel R3, or a first vertex point of a fourth red pixel R4.

Each of the first to fourth vertex points of the red matrix may overlap with the central region of the first grid structure 210. In this case, the first to fourth vertex points of the red matrix may refer to a first vertex point of a first red pixel R1, a second vertex point of a second red pixel R2, a third vertex point of a third red pixel R3, and a fourth vertex point of a fourth red pixel R4, respectively.

Figure 8:
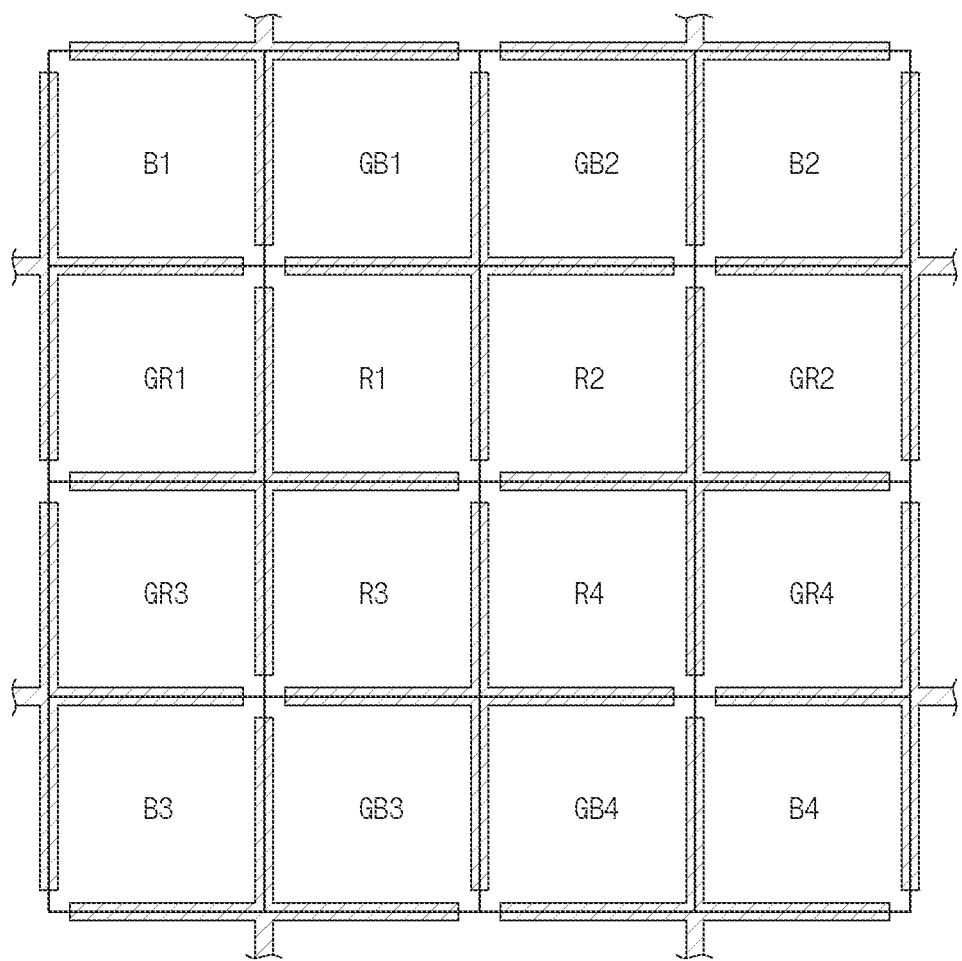
FIG. 8 is a schematic diagram illustrating another example of a first grid structure arranged in a pixel array arranged in a quad pixel structure based on some implementations of the disclosed technology.
Figure 8:
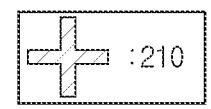

FIG. 8 is a schematic diagram illustrating another example of a first grid structure arranged in a pixel array arranged in a quad pixel structure based on some implementations of the disclosed technology.

The pixel array 800 as shown in FIG. 8 corresponds to another example of a part of the pixel array 110 shown in FIG. 1. In the example of FIG. 8, a plurality of pixels included in the pixel array 800 can also be arranged in a quad pixel structure in the same manner as in the pixel array 700 shown in FIG. 7.

Although FIG. 8 illustrates that the first grid structures 210 are arranged around the red matrix, other implementations are also possible. When the first grid structure 210 is arranged around the blue or green matrix, the substantially same description as those for the red matrix can also be applied to the blue matrix and the green matrix.

A midpoint of each side (surrounding the red pixels R1~R4) of the red matrix may overlap with the central region of the first grid structure 210. For example, the red matrix as shown in FIG. 8 includes red pixels R1, R2, R3, R4 and a side of the red matrix corresponds to a sum of sides of two red pixels. Here, the midpoint of each side of the red matrix may refer to a second vertex point (or a first vertex point of the second red pixel R2) of the first red pixel R1, a fourth vertex point (or a second vertex point of the fourth red pixel R4) of the second red pixel R2, a first vertex point (or a third vertex point of the first red pixel R1) of the third red pixel R3, or a third vertex point (or a fourth vertex point of the third red pixel R3) of the fourth red pixel R4.

Figure 9:
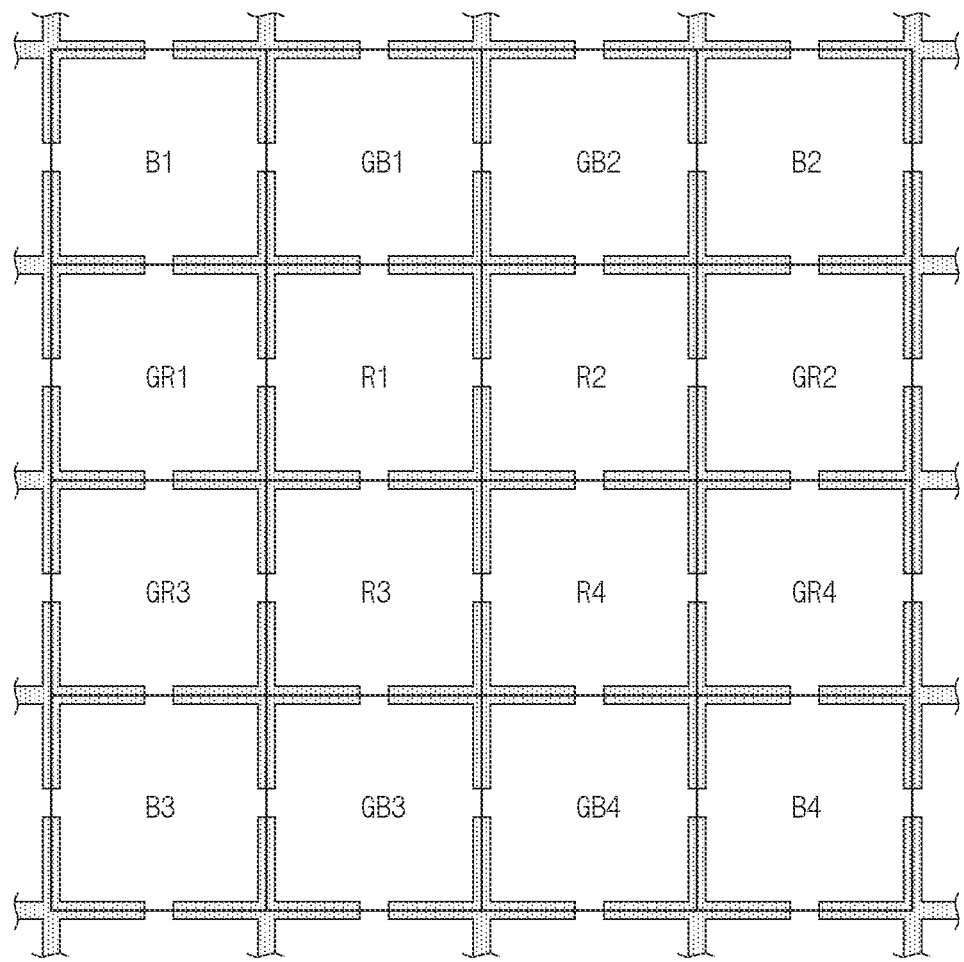
FIG. 9 is a schematic diagram illustrating an example of a second grid structure arranged in a pixel array arranged in a quad pixel structure based on some implementations of the disclosed technology.
Figure 9:
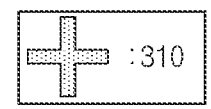

FIG. 9 is a schematic diagram illustrating an example of a second grid structure arranged in a pixel array arranged in a quad pixel structure based on some implementations of the disclosed technology.

The pixel array 900 as shown in FIG. 9 corresponds to another example of a part of the pixel array 110 shown in FIG. 1. In the example of FIG. 9, a plurality of pixels included in the pixel array 900 can also be arranged in a quad pixel structure in the same manner as in the pixel array 700 shown in FIG. 7.

Although FIG. 9 illustrates that the second grid structures 310 are arranged at a center and periphery of the red matrix, other implementations are also possible. When the first grid structure 210 is arranged at the center and periphery of the blue or green matrix, the substantially same description as those for the red matrix can also be applied to the blue matrix and the green matrix.

The center of the red matrix, each vertex point of the red matrix, and the midpoint of each side of the red matrix may overlap with the central region of the second grid structure 310.

Figure 10:
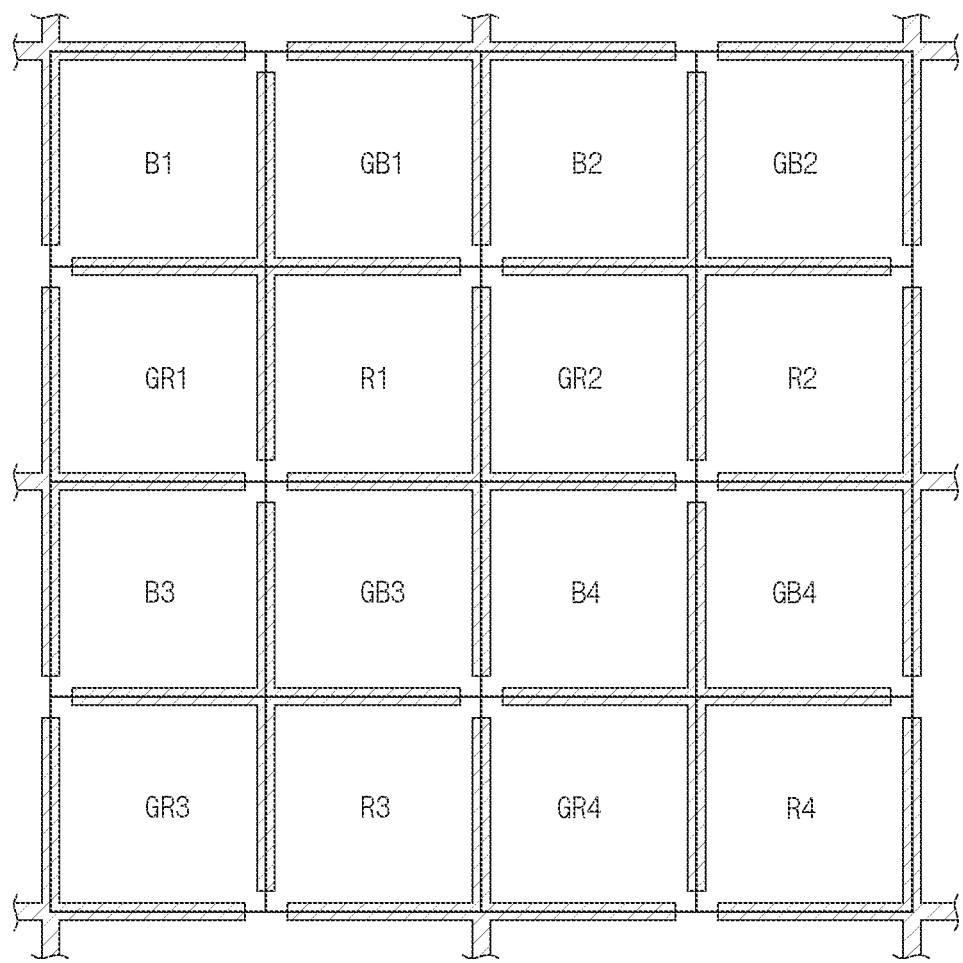
FIG. 10 is a schematic diagram illustrating an example of a first grid structure arranged in a pixel array arranged in a Bayer pattern structure based on some implementations of the disclosed technology.
Figure 10:
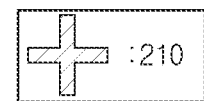

FIG. 10 is a schematic diagram illustrating an example of the first grid structure arranged in the pixel array arranged in a Bayer pattern structure based on some implementations of the disclosed technology.

The pixel array 1000 as shown in FIG. 10 corresponds to another example of a part of the pixel array 110 shown in FIG. 1. The pixel array 1000 may include first to fourth red pixels R1~R4, first to fourth blue pixels B1~B4, and first to fourth green pixels GB1~BG4 and GR1~GR4.

The pixels included in the pixel array 1000 may be arranged in a Bayer pattern structure. In the Bayer pattern structure, one red pixel, one blue pixel, and two green pixels are arranged in a Bayer pattern matrix constructing the Bayer pattern. In this case, the Bayer pattern matrix may include one red pixel and one blue pixel that face each other in a diagonal direction, and two green pixels that face each other in a diagonal direction.

Although FIG. 10 illustrates that the first grid structures 210 are arranged at a center of the Bayer pattern matrix (including the first red pixel R1, the second green pixel GR2, the third green pixel GB3, and the fourth blue pixel B4) located at the center of the pixel array, other implementations are also possible. When the first grid structure 210 is arranged at the center of another Bayer pattern matrix, the substantially same description as those of FIG. 10 can also be applied to another Bayer pattern matrix.

The center of the Bayer pattern matrix may overlap with the central region of the first grid structure 210. Here, the center of the Bayer pattern matrix may refer to a fourth vertex point of the first red pixel R1, a third vertex point of the second green pixel GR2, a second vertex point of the third green pixel GB3, or a first vertex point of the fourth blue pixel B4.

Each of the first to fourth vertex points of the Bayer pattern matrix may overlap with the central region of the first grid structure 210. In this case, the first to fourth vertex points of the Bayer pattern matrix may refer to a first vertex point of the first red pixel R1, a second vertex point of the second green pixel GR2, a third vertex point of the third green pixel GB3, and a fourth vertex point of the fourth blue pixel B4, respectively.

Figure 11:
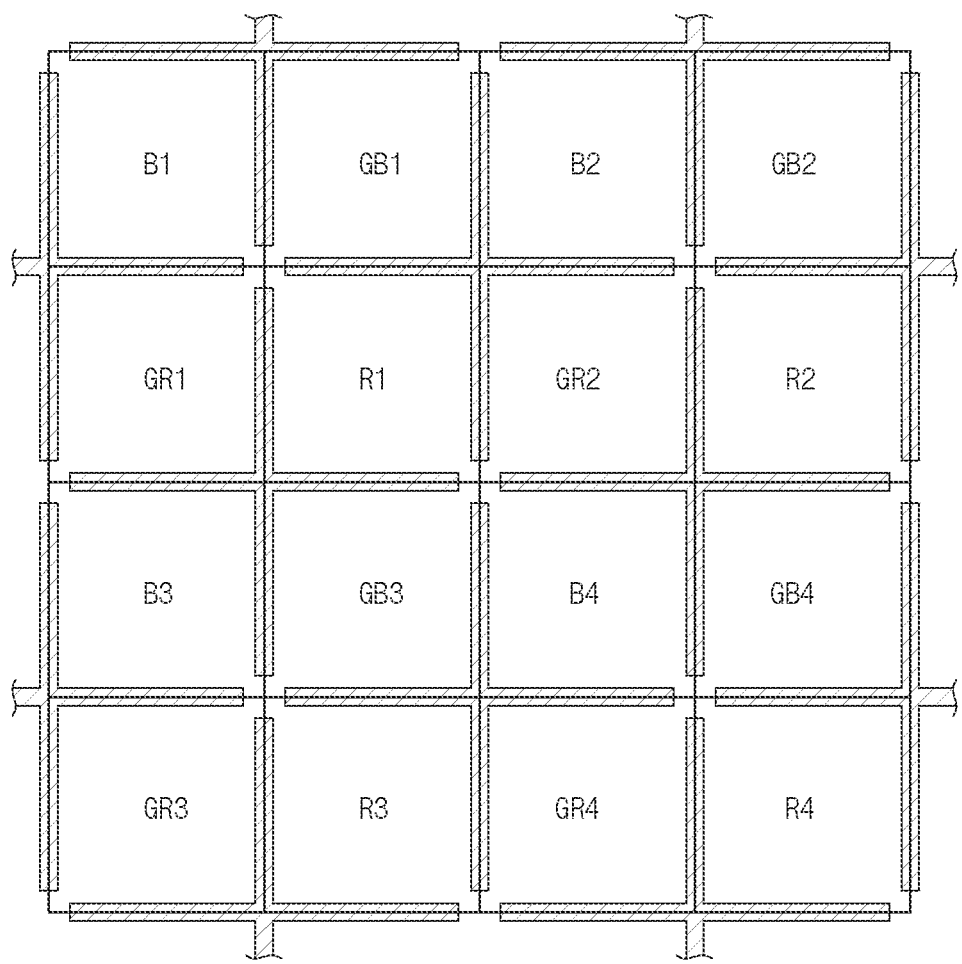
FIG. 11 is a schematic diagram illustrating another example of a first grid structure arranged in a pixel array arranged in a Bayer pattern structure based on some implementations of the disclosed technology.
Figure 11:
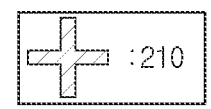

FIG. 11 is a schematic diagram illustrating another example of the first grid structure arranged in the pixel array arranged in a Bayer pattern structure based on some implementations of the disclosed technology.

The pixel array 1100 as shown in FIG. 11 corresponds to another example of some parts of the pixel array 110 shown in FIG. 1. In the example of FIG. 11, a plurality of pixels included in the pixel array 1100 can also be arranged in a Bayer pattern structure in the same manner as in the pixel array 1000 shown in FIG. 10.

Although FIG. 11 illustrates that the first grid structures 210 are arranged around the Bayer pattern matrix whose center is located at the center of the pixel array, other implementations are also possible. When the first grid structure 210 is arranged around another Bayer pattern matrix, the substantially the same description as those of FIG. 11 can also be applied to another Bayer pattern matrix.

The midpoint of each side of the Bayer pattern matrix may overlap with the central region of the first grid structure 210. In this case, the midpoint of each side of the Bayer pattern matrix may refer to a second vertex point (or a first vertex point of the second green pixel GR2) of the first red pixel R1, a fourth vertex point (or a second vertex point of the fourth blue pixel B4) of the second green pixel GR2, a first vertex point (or a third vertex point of the first red pixel R1) of the third green pixel GB3, or a third vertex point (or a fourth vertex point of the third green pixel GB3) of the fourth blue pixel B4.

Figure 12:
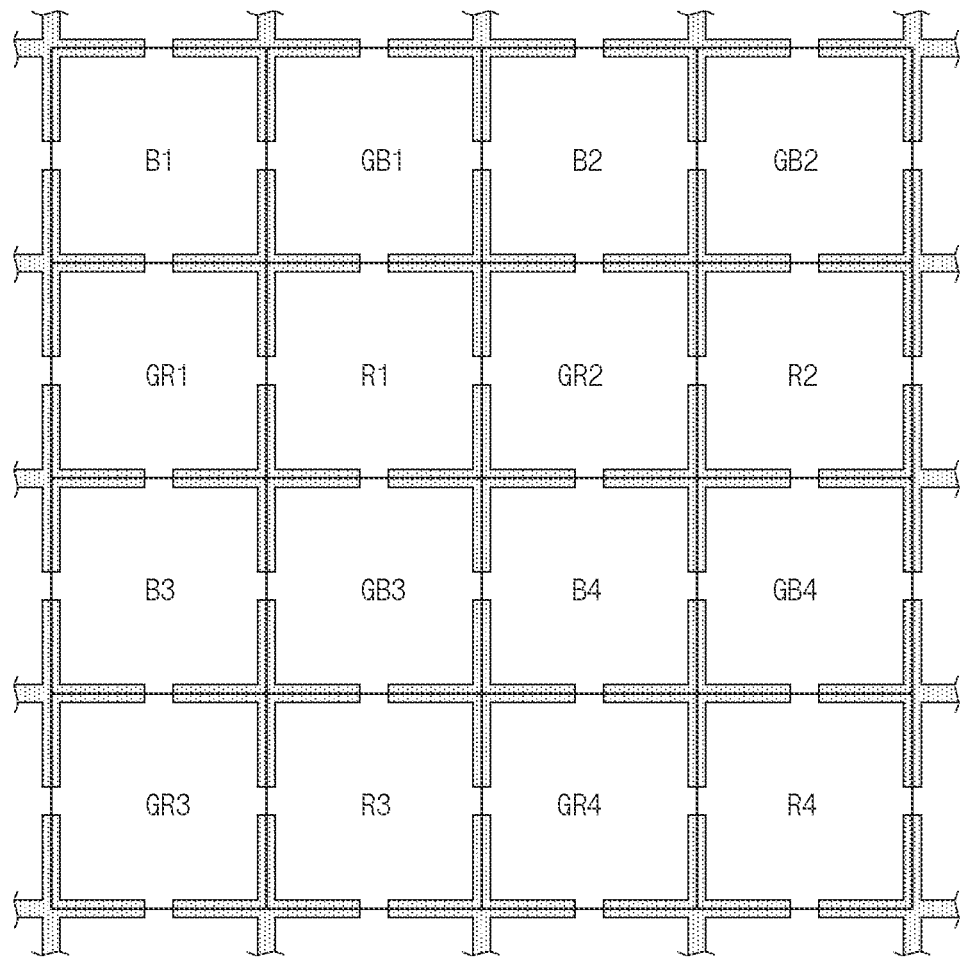
FIG. 12 is a schematic diagram illustrating an example of a second grid structure arranged in a pixel array arranged in a Bayer pattern structure based on some implementations of the disclosed technology.

FIG. 12 is a schematic diagram illustrating an example of the second grid structure arranged in the pixel array arranged in the Bayer pattern structure based on some implementations of the disclosed technology.

The pixel array 1200 as shown in FIG. 12 corresponds to another example of a part of the pixel array 110 shown in FIG. 1. In the example of FIG. 12, a plurality of pixels included in the pixel array 1200 can also be arranged in a Bayer pattern structure in the same manner as in the pixel array 1000 shown in FIG. 10.

Although FIG. 12 illustrates that the second grid structures 310 are arranged at a center and periphery of the Bayer pattern matrix whose center is located at the center of the pixel array, other implementations are also possible. Substantially the same description as those of FIG. 12 can also be applied to other Bayer pattern matrices as needed.

The center of the Bayer pattern matrix, each vertex point of the Bayer pattern matrix, and the midpoint of each side of the Bayer pattern matrix may overlap with the central region of the second grid structure 310.

According to the arrangement methods of the grid structures shown in FIGS. 7 to 12, each grid structure disposed between the adjacent pixels includes the air layer, so that performance of preventing crosstalk can be improved and structural stability of the grid structure can be guaranteed.

Figure 13:
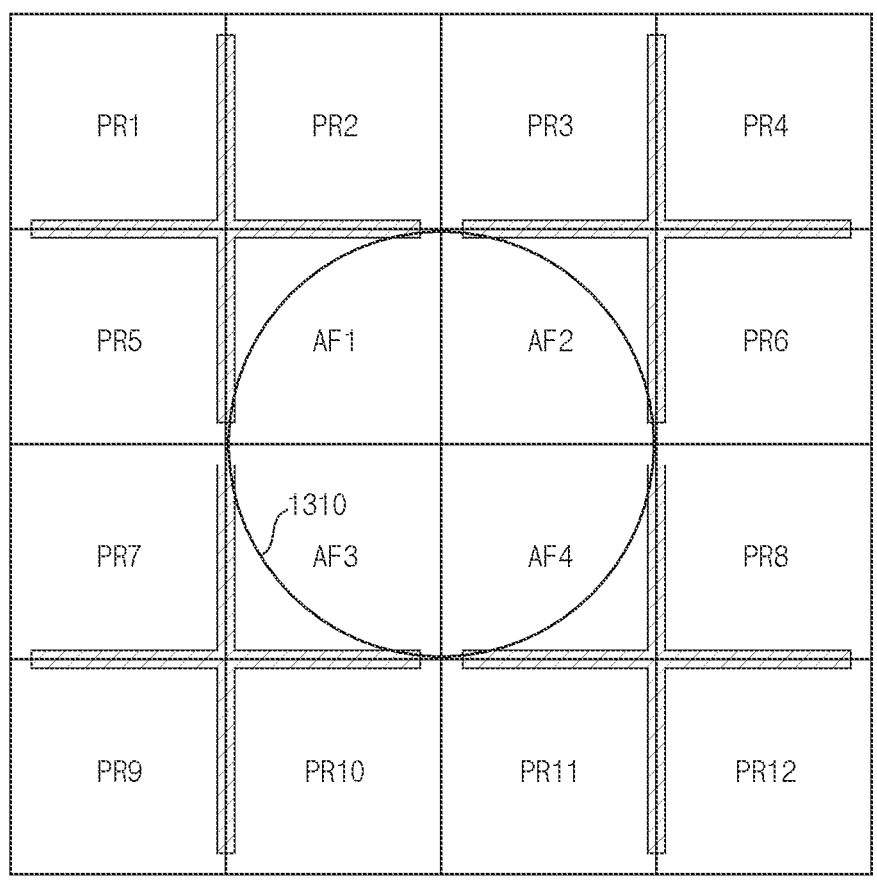
FIG. 13 is a schematic diagram illustrating an example of a grid structure arranged in a pixel array including phase detection autofocus (PDAF) pixels based on some implementations of the disclosed technology.
Figure 13:
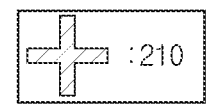

FIG. 13 is a schematic diagram illustrating an example of a grid structure arranged in a pixel array including phase detection autofocus (PDAF) pixels based on some implementations of the disclosed technology.

The pixel array 1300 as shown in FIG. 13 corresponds to another example of a part of the pixel array 110 shown in FIG. 1. In the example of FIG. 13, the pixel array 1300 may include first to fourth PDAF pixels AF1~AF4 arranged in a (2×2) matrix array, and peripheral pixels PR1~PR12 arranged to surround the first to fourth PDAF pixels AF1~AF4. The first to fourth PDAF pixels AF1~AF4 may be referred to as a first PDAF matrix.

Each of the first to fourth PDAF pixels AF1~AF4 may generate a pixel signal for detecting a phase difference. The image processor (not shown) may detect a phase difference between first and second images of a specific object using image data that is generated based on pixel signals of the first to fourth PDAF pixels AF1~AF4, and may adjust the distance between the pixel array 110 and a lens module (not shown) configured to converge incident light onto the pixel array 110 in response to the detected phase difference, so that the image processor can enable a focal point for the specific object to be in an in-focus state. In this case, the first image may be the sum of image data generated by the first and third PDAF pixels AF1 and AF3, and the second image may be the sum of image data generated by the second and fourth PDAF pixels AF2 and AF4. Alternatively, the first image may be the sum of image data generated by the first and second PDAF pixels AF1 and AF2, and the second image may be the sum of image data generated by the third and fourth PDAF pixels AF3 and AF4. Thus, the image processor may detect a phase difference from image data obtained from the pixels that are adjacent to each other in a horizontal direction, and may detect a phase difference from image data obtained from the pixels that are adjacent to each other in a vertical direction. Alternatively, the image processor may detect a more accurate phase difference by combining the detected two phase differences.

In order to generate a phase difference between the first to fourth PDAF pixels AF1~AF4, the first to fourth PDAF pixels AF1~AF4 may overlap with one microlens 1310.

Each of the first vertex point of the first PDAF pixel AF1, the second vertex point of the second PDAF pixel AF2, the third vertex point of the third PDAF pixel AF3, and the fourth vertex point of the fourth PDAF pixel AF4 may overlap with the central region of the first grid structure 210. Thus, the first grid structure 210 is not disposed between the adjacent PDAF pixels among the first to fourth PDAF pixels AF1~AF4, and the first grid structure 210 may be disposed along a periphery of the first PDAF matrix to surround the first PDAF matrix.

The first gird structure 210 is arranged along the periphery of the first PDAF matrix and is not disposed in a central area of the first PDAF matrix. Since the first to fourth PDAF pixels AF1~AF4 share only one microlens 1310, light reception (Rx) efficiency may be reduced as compared to the other case in which one microlens is disposed per pixel. By arranging the first gird structure 210 along the periphery of the first PDAF matrix, it is possible to minimize possible reduction of the light reception efficiency.

The first grid structures 210 disposed in the peripheral pixels PR1~PR12 may be changed depending on the microlenses disposed in the peripheral pixels PR1~PR12.

If only one microlens per four pixels is disposed in the peripheral pixels PR1~PR12 in the same manner as in the first to fourth PDAF pixels AF1~AF4, the first grid structures can be disposed in the peripheral pixels PR1~PR12 in the same manner as in the first grid structures 210 shown in FIG. 13. For example, the first vertex point of the pixel located at an upper side of the second peripheral pixel PR2 may overlap with the central region of the first grid structure.

If only one microlens for each pixel is disposed in the peripheral pixels PR1~PR12 in a different way from the first to fourth PDAF pixels AF1~AF4, the first grid structures may be disposed in the peripheral pixels PR1~PR12 in the same manner as in the first grid structures 210 shown in FIG. 2. For example, the second vertex point of the second peripheral pixel PR2 may overlap with the central region of the first grid structure.

Figure 14A:
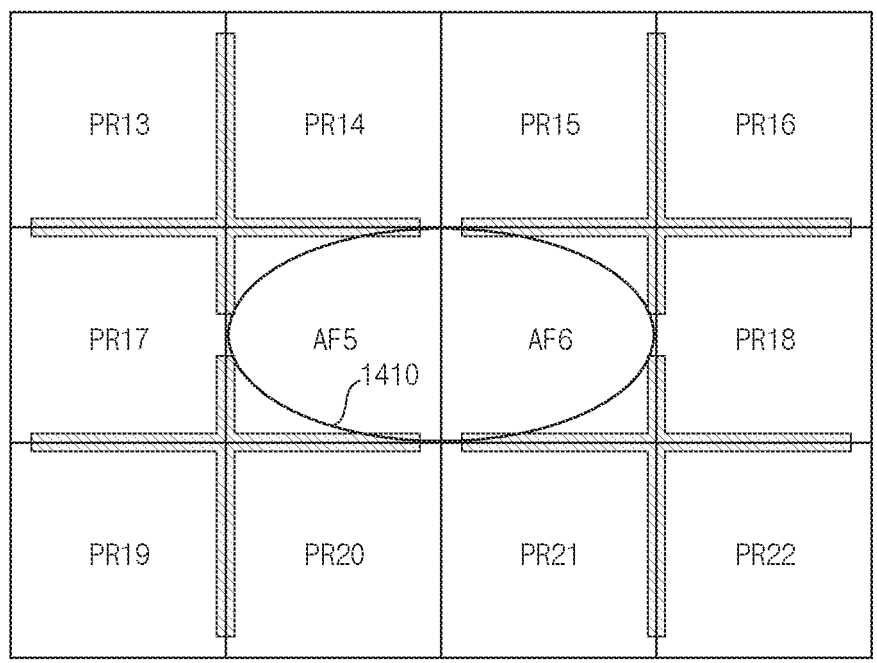
FIG. 14A is a schematic diagram illustrating another example of a grid structure arranged in a pixel array including phase detection autofocus (PDAF) pixels based on some implementations of the disclosed technology.

FIG. 14A is a schematic diagram illustrating another example of the grid structure arranged in the pixel array including phase detection autofocus (PDAF) pixels based on some implementations of the disclosed technology.

The pixel array 1400a as shown in FIG. 14A corresponds to another example of a part of the pixel array 110 shown in FIG. 1. In the example of FIG. 14A, the pixel array 1400a may include fifth and sixth PDAF pixels AF5~AF6 arranged in a (1×2) matrix array, and peripheral pixels PR13~PR22 arranged to surround the fifth and sixth PDAF pixels AF5~AF6. The fifth and sixth PDAF pixels AF5~AF6 may be referred to as a second PDAF matrix.

Each of the fifth and sixth PDAF pixels AF5~AF6 may generate a pixel signal for detecting a phase difference. The image processor (not shown) may detect a phase difference between third and fourth images of a specific object using image data that is generated based on pixel signals of the fifth and sixth PDAF pixels AF5~AF6, and may adjust the distance between the pixel array 110 and the lens module configured to converge incident light onto the pixel array 110 in response to the detected phase difference, so that the image processor can enable a focal point for the specific object to be in an in-focus state. In this case, the third image may be image data generated by the fifth PDAF pixel AF5, and the fourth image may be image data generated by the sixth PDAF pixel AF6. That is, the image processor may detect a phase difference from image data obtained from the pixels that are adjacent to each other in a horizontal direction.

In order to generate a phase difference between the fifth and sixth PDAF pixels AF5~AF6, the fifth and sixth PDAF pixels AF5~AF6 may overlap with one microlens 1410.

Not only the first and third vertex points of the fifth PDAF pixel AF5, but also the second and fourth vertex points of the sixth PDAF pixel AF6 may overlap with the central region of the third grid structure 220. Each of the third grid structures 220 may be configured in a manner that one side of the first vertical extension region VA1 of the first grid structure 210 is reduced in size to correspond to one side of the second vertical extension region VA2 of the second grid structure 310. Thus, the extension length formed when the third grid structure 220 extends in one direction (e.g., in a lower direction) from any one (e.g., the first vertex point of the fifth PDAF pixel AF5) of vertex points overlapping the third grid structure 220 may be less than half the length of one side of the PDAF pixel (e.g., AF5). For example, the third grid structure 220 may be identical or similar in shape to the Latin cross shape.

In addition, the third grid structure 220 disposed at the first vertex point of the fifth PDAF pixel AF5 may be vertically symmetrical to the third grid structure 220 disposed at the third vertex point of the fifth PDAF pixel AF5. The third grid structure disposed at the second vertex point of the sixth PDAF pixel AF6 may be vertically symmetrical to the third grid structure 220 disposed at the fourth vertex point of the sixth PDAF pixel AF6.

The third grid structure 220 is not disposed between the fifth and sixth PDAF pixels AF5~AF6, and the third grid structure 220 may be disposed along a periphery of the second PDAF matrix to surround the second PDAF matrix.

In some implementations, if only one microlens for each pixel is disposed in the peripheral pixels PR13~PR22 in a different way from the fifth and sixth PDAF pixels AF5~AF6, the first grid structures may be disposed in the peripheral pixels PR13~PR22 in the same manner as in the first grid structures 210 shown in FIG. 2. For example, the second vertex point of the 14$^{th}$ peripheral pixel PR14 may overlap with the central region of the first grid structure. Alternatively, the second grid structures may be disposed in the peripheral pixels PR13~PR22 in the same manner as in the second grid structures 310 shown in FIG. 3, and the second grid structures can be deformed (e.g., extension or omission of some parts of the vertical or horizontal extension region) to minimize crosstalk between adjacent pixels.

In some other implementations, an appropriate grid structure from among the first to third grid structures 210, 220, and 310 may be disposed in the peripheral pixels PR13~PR22 according to the shape of microlenses disposed in the peripheral pixels PR13~PR22 or the types (e.g., PDAF pixel, color pixel, etc.) of peripheral pixels PR13~PR22.

Figure 14B:
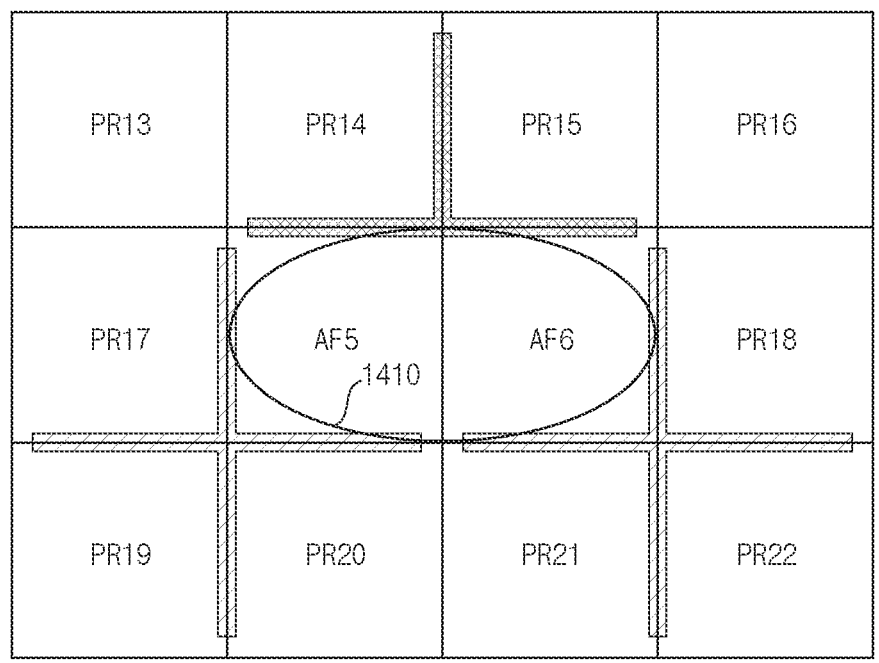
FIG. 14B is a schematic diagram illustrating still another example of a grid structure arranged in a pixel array including phase detection autofocus (PDAF) pixels based on some implementations of the disclosed technology.
Figure 14B:
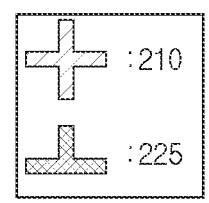

FIG. 14B is a schematic diagram illustrating still another example of the grid structure arranged in the pixel array including phase detection autofocus (PDAF) pixels based on some implementations of the disclosed technology.

The pixel array 1400b as shown in FIG. 14B corresponds to another example of a part of the pixel array 110 shown in FIG. 1. In the example of FIG. 14B, the pixel array 1400b may include fifth and sixth PDAF pixels AF5~AF6 arranged in a (1×2) matrix array, and peripheral pixels PR13~PR22 arranged to surround the fifth and sixth PDAF pixels AF5~AF6. The remaining parts of the pixel array 1400b other than the layout structure of the pixel array 1400a are substantially identical to those of the pixel array 1400a, and as such redundant description thereof will herein be omitted for brevity.

A midpoint (e.g., the second vertex point of the fifth PDAF pixel AF5 or the first vertex point of the sixth PDAF pixel AF6) of an upper side of the second PDAF matrix may overlap with the central region of a fourth grid structure 225. The fourth grid structure 225 may be configured in a manner that one side of the first vertical extension region VA1 is omitted from the first grid structure 210 with respect to the center of the first grid structure 210. That is, the fourth grid structure 225 may include the central region formed to overlap the midpoint of the upper side of the second PDAF matrix, and may not extend toward the center of the second PDAF matrix. For example, the fourth grid structure 225 may be identical or similar in shape to St Anthony's cross.

In addition, the central region of the first grid structure 210 may be disposed not only at the third vertex point of the fifth PDAF pixel AF5, but also at the fourth vertex point of the sixth PDAF pixel AF6.

Although FIG. 14B illustrates that the fourth grid structure 225 is disposed above the fifth and sixth PDAF pixels AF5~AF6, other implementations are also possible. For example, the fourth grid structure 225 can also be disposed below the fifth and sixth PDAF pixels AF5~AF6 according to another embodiment. In this case, the fourth grid structure 225 disposed above the fifth and sixth PDAF pixels AF5~AF6 and the fourth grid structure 225 disposed below the fifth and sixth PDAF pixels AF5~AF6 may be vertically symmetrical to each other. The central region of the first grid structure 210 may be disposed not only at the first vertex point of the fifth PDAF pixel AF5, but also at the second vertex point of the sixth PDAF pixel AF6.

In some implementations, if only one microlens for each pixel is disposed in the peripheral pixels PR13~PR22 in a different way from the fifth and sixth PDAF pixels AF5~AF6, the first grid structure may be disposed in the peripheral pixels PR13~PR22 in the same manner as in the first grid structures 210 shown in FIG. 2. For example, each of the first vertex point of the 14$^{th}$ peripheral pixel PR14, the second vertex point of the 15$^{th}$ peripheral pixel PR15, and the fourth vertex point of the 20$^{th}$ peripheral pixel PR20 may overlap with the central region of the first grid structure. Alternatively, the second grid structure may be disposed in the peripheral pixels PR13~PR22 in the same manner as in the second grid structures 310 shown in FIG. 3, and the second grid structures can be deformed (e.g., extension or omission of some parts of the vertical or horizontal extension region) to minimize crosstalk between adjacent pixels.

In some other implementations, an appropriate grid structure from among the first to fourth grid structures 210, 220, 225, and 310 may be disposed in the peripheral pixels PR13~PR22 according to the shape of microlenses disposed in the peripheral pixels PR13~PR22 or the types (e.g., PDAF pixel, color pixel, etc.) of peripheral pixels PR13~PR22.

Figure 15:
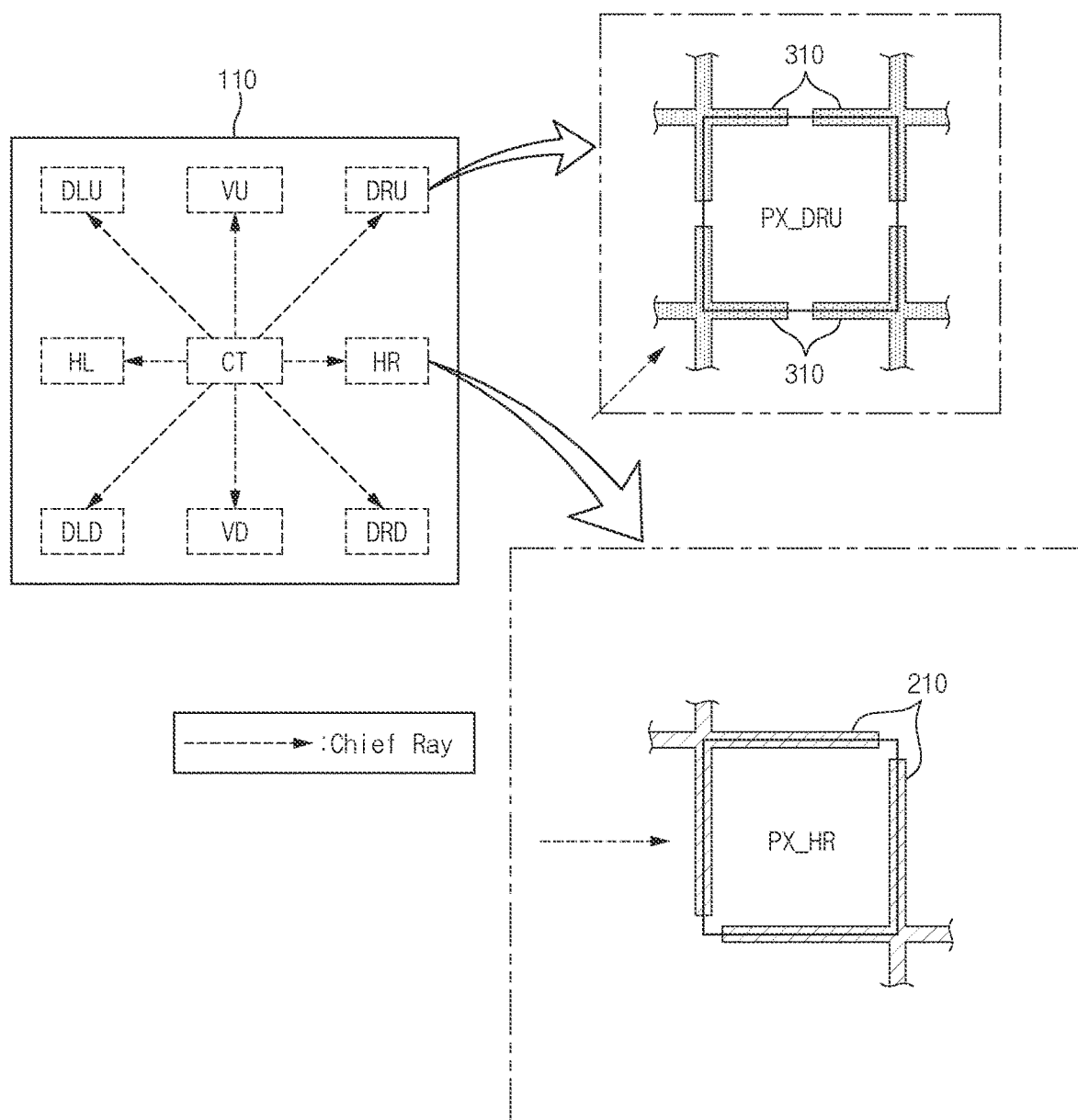
FIG. 15 is a conceptual diagram illustrating that a shape of the grid structure is changed in response to the position of each pixel included in the pixel array based on some implementations of the disclosed technology.

FIG. 15 is a conceptual diagram illustrating that a shape of the grid structure is changed in response to the position of each pixel included in the pixel array based on some implementations of the disclosed technology.

Referring to FIG. 15, the pixel array 110 may be divided into a plurality of regions according to relative positions of pixels included therein.

The pixel array 110 may include a center zone CT, a first horizontal edge zone HL, a second horizontal edge zone HR, a first vertical edge zone VU, a second vertical edge zone VD, and first to fourth diagonal edge zones DLU, DRD, DLD, and DRU. Each zone included in the pixel array 110 may include a predetermined number of pixels.

The center zone CT may be located at the center of the pixel array 110.

The first horizontal edge zone HL and the second horizontal edge zone HR may be located at the edges of the pixel array 110 in a horizontal direction of the center zone CT with respect to a horizontal line passing through the center zone CT. In some implementations, each of the edges of the pixel array 110 may conceptually include a plurality of pixels located within a predetermined distance from the outermost pixel of the pixel array 110.

The first vertical edge zone VU and the second vertical edge zone VD may be disposed at the edges of the pixel array 110 in the vertical direction of the center zone CT with respect to a vertical line passing through the center zone CT.

The first diagonal edge zone DLU may be disposed at the edge of the pixel array 110 in a left-upper direction of the center zone CT with respect to a first diagonal direction (i.e., a direction in which the horizontal line rotates at a positive angle) passing through the center zone CT.

The second diagonal edge zone DRD may be disposed at the edge of the pixel array 110 in a right-lower direction of the center zone CT with respect to the first diagonal direction passing through the center zone CT.

The third diagonal edge zone DLD may be disposed at the edge of the pixel array 110 in a left-lower direction of the center zone CT with respect to a second diagonal direction (i.e., a direction in which the horizontal line rotates at a negative angle) passing through the center zone CT.

The fourth diagonal edge zone DRU may be disposed at the edge of the pixel array 110 in a right-upper direction of the center zone CT with respect to the second diagonal direction passing through the center zone CT.

The image sensing device 100 shown in FIG. 1 may further include a lens module. The lens module may be disposed between the pixel array 110 and a target object to be captured. The lens module may collect light reflected from the target object, and may allow the collected light to be focused onto pixels (PXs) of the pixel array 110. The lens module may include one or more lenses that are arranged to be focused upon an optical axis. In this case, the optical axis may pass through the center zone CT of the pixel array 110.

A chief ray having passed through the lens module may be emitted in the direction from the optical axis to a circle (e.g., a circle passing through four vertex points of the pixel array 110) centering around the optical axis. The chief ray for the first horizontal edge zone HL may be emitted in the left direction from the center zone CT, the chief ray for the second horizontal edge zone HR may be emitted in the right direction from the center zone CT, the chief ray for the first vertical edge zone VU may be emitted upward from the center zone CT, and the chief ray for the second vertical edge zone VD may be emitted downward from the center zone CT. On the other hand, the chief ray for the first diagonal edge zone DLU may be emitted in a left-upper direction from the center zone CT, the chief ray for the second diagonal edge zone DRD may be emitted in a right-lower direction from the center zone CT, the chief ray for the third diagonal edge zone DLD may be emitted in a left-lower direction from the center zone CT, and the chief ray for the fourth diagonal edge zone DRU may be emitted in a right-upper direction from the center zone CT.

In some implementations, the grid structure disposed in the corresponding pixel may be changed depending on the relative position of the corresponding pixel included in the pixel array 110.

For pixels included in the diagonal edge regions DLU, DRU, DLD, and DRD, the chief ray may be incident upon the pixels in the first or second diagonal direction, crosstalk of one pixel that is adjacent to the pixel (e.g., PX_DRU) in the horizontal or vertical direction may be greater than crosstalk of the other pixel that is adjacent to a pixel (e.g., PX_DRU) in the first or second diagonal direction. In this case, crosstalk components of the adjacent pixel may refer to leakage light that is incident upon a light incident layer of the adjacent pixel and is then transmitted to a light incident layer of the corresponding pixel. Therefore, the second grid structure 310 is disposed in the pixel (e.g., PX_DRU), such that the second grid structure 310 can more effectively block crosstalk components of pixels that are adjacent to each other in the first or second diagonal direction.

For pixels included in the horizontal or vertical edge regions VU, HR, HL, and VD, the chief ray may be incident upon the pixels in the horizontal or vertical direction, crosstalk of one pixel that is adjacent to a pixel (e.g., PX_HR) in the horizontal or vertical direction may be greater than crosstalk of the other pixel that is adjacent to the pixel (e.g., PX_HR) in the first or second diagonal direction. Therefore, the first grid structure 210 is disposed in the pixel (e.g., PX_HR), such that the first grid structure 210 can more effectively block crosstalk components of pixels that are adjacent to each other in the horizontal or vertical direction.

Although FIG. 15 illustrates that the grid structure is changed in shape by dividing the pixel array 110 into eight edge regions for convenience of description, other implementations are also possible, and it should be noted that the pixel array 110 can be divided into many more regions so that the position and shape (e.g., the length of the vertical or horizontal extension region) of the grid structure can be gradually changed.

As is apparent from the above description, the image sensing device based on some implementations of the disclosed technology can distribute pressure applied to a vulnerable point of the air grid, such that the image sensing device including the air grid can effectively prevent collapse (or popping) of the air grid at the vulnerable point of the air grid.

In addition, as the air grid is formed in a cross shape, morphological stability of the air grid can be maintained in a fabrication process of the image sensing device including the air grid.

Although a number of illustrative embodiments have been described, it should be understood that modifications and enhancements to the disclosed embodiments and other embodiments can be devised based on what is described and/or illustrated in this patent document.

What is claimed is:

1. An image sensing device comprising:
   a pixel array including a plurality of pixels, each pixel configured to generate a pixel signal corresponding to intensity of incident light; and
   a plurality of grid structures, each grid structure disposed to overlap with a boundary between adjacent pixels among the plurality of pixels so as to optically isolate the adjacent pixels,
   wherein each of the plurality of grid structures includes regions that form a cross shape,
   wherein adjacent cross shapes of the plurality of grid structures are spaced apart from each other, and
   wherein the plurality of grid structures is disposed outside of a substrate including photoelectric conversion regions of the plurality of pixels.

2. The image sensing device according to claim 1, wherein the regions of a grid structure of the plurality of grid structures includes:
   a horizontal extension region extending in a first direction; and
   a vertical extension region extending in a second direction perpendicular to the first direction.

3. The image sensing device according to claim 2, wherein a grid structure of the plurality of grid structures includes:
   a central region in which the horizontal extension region and the vertical extension region are disposed to cross each other,
   wherein the central region is disposed to overlap with a vertex point of a corresponding pixel.

4. The image sensing device according to claim 3, wherein:
the horizontal extension region extends from the vertex point and has length less than a length of one side of the pixel; and
the vertical extension region extends from the vertex point and has a length less than the length of one side of the pixel.

5. The image sensing device according to claim 1, wherein:
the pixel includes:
a pair of first vertex points that face each other in a first diagonal direction;
a pair of second vertex points that face each other in a second diagonal direction different from the first diagonal direction, and
the plurality of grid structures is disposed to overlap with the pair of first vertex points without overlapping the pair of second vertex points.

6. The image sensing device according to claim 5, wherein:
a grid structure of the plurality of grid structures extends from a vertex point overlapping the grid structure and has a length greater than half a length of one side of the pixel.

7. The image sensing device according to claim 5, wherein:
the plurality of pixels forms a color matrix in which color pixels corresponding to any one of red color, blue color, and green color are arranged in a (2×2) matrix array; and
the plurality of grid structures is disposed to overlap with a center of the color matrix and vertex points of the color matrix.

8. The image sensing device according to claim 5, wherein:
the plurality of pixels forms a color matrix in which color pixels corresponding to any one of red color, blue color, and green color are arranged in a (2×2) matrix array; and
the plurality of grid structures is disposed to overlap with a midpoint of each side of the color matrix.

9. The image sensing device according to claim 5, wherein:
the plurality of pixels forms a Bayer pattern matrix in which a red pixel, a blue pixel, and green pixels are arranged in a Bayer pattern; and
the plurality of grid structures is disposed to overlap with a center point of the Bayer pattern matrix and vertex points of the Bayer pattern matrix.

10. The image sensing device according to claim 5, wherein:
the plurality of pixels forms a Bayer pattern matrix in which a red pixel, a blue pixel, and green pixels are arranged in a Bayer pattern; and
the plurality of grid structures is disposed to overlap with a midpoint of each side of the Bayer pattern matrix.

11. The image sensing device according to claim 1, wherein:
the pixel includes first to fourth vertex points; and
the plurality of grid structures is disposed to overlap with each of the first to fourth vertex points.

12. The image sensing device according to claim 11, wherein:
a grid structure of the plurality of grid structures extends from one of the first to fourth vertex points overlapping the grid structure and has a length less than half a length of one side of the pixel.

13. The image sensing device according to claim 1, wherein:
the plurality of pixels includes phase detection autofocus (PDAF) pixels configured to perform phase-difference detection and arranged in a (2×2) matrix array to form a phase detection autofocus (PDAF) matrix;
the plurality of grid structures is disposed to overlap with vertex points of the PDAF matrix; and
a grid structure of the plurality of grid structures extends from one of the vertex points overlapping the grid structure and has a length greater than half a length of one side of the pixel.

14. The image sensing device according to claim 1, wherein:
the plurality of pixels includes phase detection autofocus (PDAF) pixels configured to perform phase-difference detection and arranged in a (1×2) matrix array to form a phase detection autofocus (PDAF) matrix;
the plurality of grid structures is disposed to overlap with vertex points of the PDAF matrix; and
a grid structure of the plurality of grid structures extends in one direction from one of the vertex points overlapping the grid structure and has a length less than half a length of one side of the pixel.

15. The image sensing device according to claim 1, wherein:
the plurality of pixels includes phase detection autofocus (PDAF) pixels configured to perform phase-difference detection and arranged in a (1×2) matrix array to form a phase detection autofocus (PDAF) matrix; and
the plurality of grid structures is configured to include a grid structure,
wherein
a grid structure of the plurality of grid structures includes a central region formed to overlap with a midpoint of an upper side or a lower side of the PDAF matrix without extending toward a center point of the PDAF matrix.

16. The image sensing device according to claim 1, wherein:
the plurality of pixels includes:
a diagonal edge region diagonally spaced apart from the pixel array with respect to a center point of the pixel array;
a horizontal edge region horizontally spaced apart from the pixel array with respect to the center point of the pixel array; and
a vertical edge region vertically spaced apart from the pixel array with respect to the center point of the pixel array,
wherein
a grid structure included in the diagonal edge region has a length less than a length of a grid structure included in the horizontal edge region or the vertical edge region.

17. An image sensing device comprising:
a pixel configured to generate a pixel signal corresponding to intensity of incident light and include first to fourth vertex points; and
a plurality of grid structures, each grid structure disposed at any one of the first to fourth vertex points, wherein each of the plurality of grid structures has a cross shape,
wherein adjacent cross shapes of the plurality of grid structures are spaced apart from each other, and
wherein the plurality of grid structures is disposed outside of a substrate including a photoelectric conversion region of the pixel.

18. The image sensing device of claim 17, wherein the pixel includes an optical filter configured to selectively transmit incident light having a certain wavelength,
wherein each grid structure further includes a capping layer, and
wherein the capping layer has a refractive index lower than a refractive index of the optical filter.

19. The image sensing device of claim 17, wherein a portion of each of the plurality of grid structures that extends in a horizontal direction or a vertical direction has a length less than a length of a side of the pixel.

20. The image sensing device according to claim 1, wherein each of the plurality of grid structures is configured to include an air layer.

21. The image sensing device of claim 18, wherein each of the plurality of grid structures includes an air layer filled with air.

22. An image sensing device comprising:
a pixel array including a plurality of pixels, each pixel configured to generate a pixel signal corresponding to intensity of incident light; and
a plurality of grid structures, each grid structure disposed to overlap with a boundary between adjacent pixels among the plurality of pixels so as to optically isolate the adjacent pixels,
wherein:
each of the plurality of grid structures includes regions that form a cross shape,
a pixel of the pixel array includes first to fourth vertex points,
the plurality of grid structures is disposed to overlap with each of the first to fourth vertex points, and
the plurality of grid structures includes a grid structure that extends from one of the first to fourth vertex points overlapping the grid structure and has a length less than half a length of one side of the pixel.

23. The image sensing device according to claim 22, wherein each of the plurality of grid structures is configured to include an air layer.

* * * * *